United States Patent
Kang et al.

(10) Patent No.: US 7,250,371 B2
(45) Date of Patent: Jul. 31, 2007

(54) REDUCTION OF FEATURE CRITICAL DIMENSIONS

(75) Inventors: Sean S. Kang, Fremont, CA (US); Sangheon Lee, San Jose, CA (US); Wan-Lin Chen, Sunnyvale, CA (US); Eric A. Hudson, Berkeley, CA (US); S. M. Reza Sadjadi, Saratoga, CA (US); Gan Ming Zhao, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 279 days.

(21) Appl. No.: 10/648,953

(22) Filed: Aug. 26, 2003

(65) Prior Publication Data

US 2005/0048785 A1 Mar. 3, 2005

(51) Int. Cl.
*H01L 21/311* (2006.01)

(52) U.S. Cl. ........... 438/696; 438/639; 438/668; 438/702; 257/E23.175; 257/E21.232; 257/E21.235; 257/E21.238

(58) Field of Classification Search .......... 438/694, 438/696, 700, 720, 735, 736, 689, 622, 624, 438/629, 638, 639, 763, 786, 788, 791, 792, 438/668, 702; 257/E23.175, E21.232, E21.235, 257/E21.238
See application file for complete search history.

(56) References Cited

U.S. PATENT DOCUMENTS

| | | | |
|---|---|---|---|
| 4,151,034 A * | 4/1979 | Yamamoto et al. .... | 156/345.31 |
| 4,871,630 A * | 10/1989 | Giammarco et al. ..... | 430/14 |
| 5,273,609 A * | 12/1993 | Moslehi ............. | 156/345.28 |
| 5,296,410 A * | 3/1994 | Yang .................... | 438/696 |
| 5,501,893 A | 3/1996 | Laermer et al. ........ | 428/161 |
| 5,895,740 A * | 4/1999 | Chien et al. ........... | 430/313 |
| 6,187,685 B1 | 2/2001 | Hopkins et al. ........ | 438/710 |
| 6,261,962 B1 | 7/2001 | Bhardwaj et al. ...... | 438/702 |
| 6,368,974 B1 | 4/2002 | Tsai et al. ............. | 438/695 |
| 6,656,282 B2 * | 12/2003 | Kim et al. ............. | 118/695 |
| 6,740,977 B2 * | 5/2004 | Ahn et al. ............. | 257/760 |
| 6,750,150 B2 * | 6/2004 | Chung et al. ........... | 438/706 |
| 6,780,708 B1 * | 8/2004 | Kinoshita et al. ....... | 438/241 |
| 2005/0164479 A1 | 7/2005 | Perng et al. | |

OTHER PUBLICATIONS

U.S. Appl. No. 11/016,455, entitled "Reduction of Etch Mask Feature Critical Dimensions", by inventors Huang et al., filed Dec. 16, 2004.
U.S. Appl. No. 11/208,098, entitled "Etch Features with Reduced Line Edge Roughness", by inventors Sadjadi et al., filed Aug. 18, 2005.
International Search Report, dated Mar. 20, 2006.
Eric Eisenbraun et al., "Atomic Layer Deposition (ALD) of Tantalum-based Materials for Zero Thickness Copper Barrier Applications", Proceedings of IEEE (2001), pp. 207-209.

* cited by examiner

*Primary Examiner*—Matthew Smith
*Assistant Examiner*—Julio J Maldonado
(74) *Attorney, Agent, or Firm*—Beyer Weaver LLP

(57) ABSTRACT

A feature in a layer is provided. A photoresist layer is formed over the layer. The photoresist layer is patterned to form photoresist features with photoresist sidewalls, where the photoresist features have a first critical dimension. A conformal layer is deposited over the sidewalls of the photoresist features to reduce the critical dimensions of the photoresist features. Features are etched into the layer, wherein the layer features have a second critical dimension, which is less than the first critical dimension.

11 Claims, 19 Drawing Sheets

REDUCTION OF FEATURE CRITICAL DIMENSIONS

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a layer 108 over a substrate 104, with a patterned photoresist layer 112, over an ARL (Anti-reflective layer) 110 over the layer 108 to be etched forming a stack 100. The photoresist pattern has a critical dimension (CD), which may be the width 116 of the smallest feature. Presently, for 248 nm photoresist a typical CD for the photoresist may be 230-250 nm using conventional processes. Due to optical properties dependent on wavelength, photoresist exposed by longer wavelength light has larger theoretical minimal critical dimensions.

A feature 120 may then be etched through the photoresist pattern, as shown in FIG. 1B. Ideally, the CD of the feature (the width of the feature) is equal to the CD 116 of the feature in the photoresist 112. In practice, the CD of the feature 116 may be larger than the CD of the photoresist 112 due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may more easily deform under plasma etch conditions.

In the etching of conductive layers, such as in the formation of memory devices, it is desirable to increase device density without diminishing performance.

SUMMARY OF THE INVENTION

To achieve the foregoing and in accordance with the purpose of the present invention a method for forming a feature in a layer is provided. A photoresist layer is formed over the layer. The photoresist layer is patterned to form photoresist features with photoresist sidewalls, where the photoresist features have a first critical dimension. A conformal layer is deposited over the sidewalls of the photoresist features to reduce the critical dimensions of the photoresist features. Features are etched into the layer, wherein the layer features have a second critical dimension, which is less than the first critical dimension.

In another embodiment of the invention, a method for forming a feature in a layer is provided. A photoresist layer is formed over the layer. The photoresist layer is patterned to form photoresist features with photoresist sidewalls, where the photoresist features have a first critical dimension. A layer is deposited over the sidewalls of the photoresist features to reduce the critical dimensions of the photoresist features. The depositing the layer over the sidewalls of the photoresist feature, comprises, a first deposition with a first gas chemistry to form a first deposition plasma, and a second deposition with a second gas chemistry to form a second deposition plasma, wherein the first gas chemistry is different than the second gas chemistry. Features are etched into the layer, wherein the layer features have a second critical dimension, wherein the second critical dimension is not greater than 70% of the first critical dimension.

In another embodiment of the invention an apparatus for forming a feature in a layer, wherein the layer is supported by a substrate and wherein the layer is covered by a photoresist mask with photoresist features with a first CD is provided. A plasma processing chamber, comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source in fluid connection with the gas inlet comprises a first deposition gas source, a second deposition gas source, and an etchant gas source. A controller controllably connected to the gas source and the at least one electrode comprises at least one processor and computer readable media. The computer readable media comprises computer readable code for providing at least three deposition cycles to form a sidewall deposition on a photoresist mask to form features with a second CD, within the photoresist features, computer readable code for providing a flow of an etchant gas from the etchant gas source to the plasma processing chamber after completion of the at least three deposition cycles, and computer readable code for etching features in the layer, using the etchant gas wherein the features in the layer have a third CD. The computer code for providing at least three deposition cycles to form a sidewall deposition on a photoresist mask to form features with a second CD within the photoresist features comprises computer readable code for providing a flow of a first deposition gas from the first deposition gas source to the plasma processing chamber enclosure, computer readable code for stopping the flow of the first deposition gas from the first deposition gas source to the plasma processing chamber enclosure, computer readable code for providing a flow of a second deposition gas from the second deposition gas source to the plasma processing chamber enclosure after the flow of the first deposition gas is stopped, and computer readable code for stopping the flow of the second deposition gas from the second deposition gas source to the plasma processing chamber enclosure.

In another embodiment of the invention a method of forming a plurality of conductive lines is provided. A conductive layer is placed over a substrate. A mask is formed, where the mask defines a plurality of mask lines with mask spaces between the mask lines, where the mask spaces have a width and wherein the mask lines have a width and have sidewalls. A conformal layer is deposited over the sidewalls of the mask. The conductive layer is etched through the mask to form conductive lines and spaces between the conductive lines, where the conductive lines have a width and the spaces between the conductive line have widths, where the widths of the spaces between the conductive lines is less than the widths of the mask spaces, and where the widths of the conductive lines is greater than the widths of the line masks.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention provides features with small critical dimensions (CD). More specifically, the invention provides a features with CD's that are less than the CD of the photoresist pattern used to etch the feature.

Figure 1A:
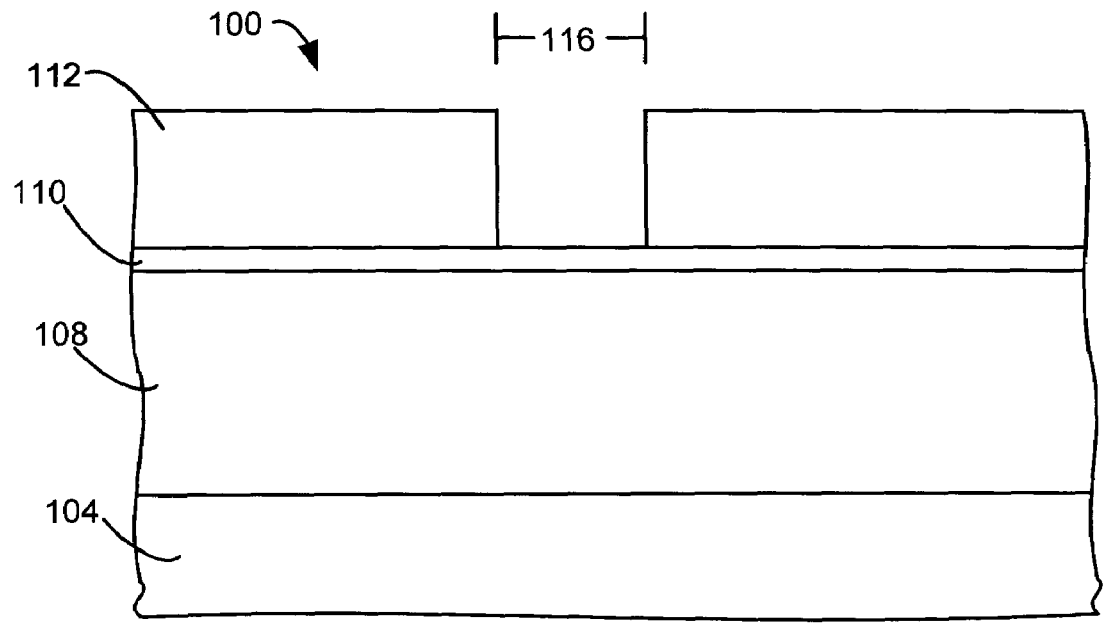
FIGS. 1A-B are schematic cross-sectional views of a stack etched according to the prior art.
Figure 1B:
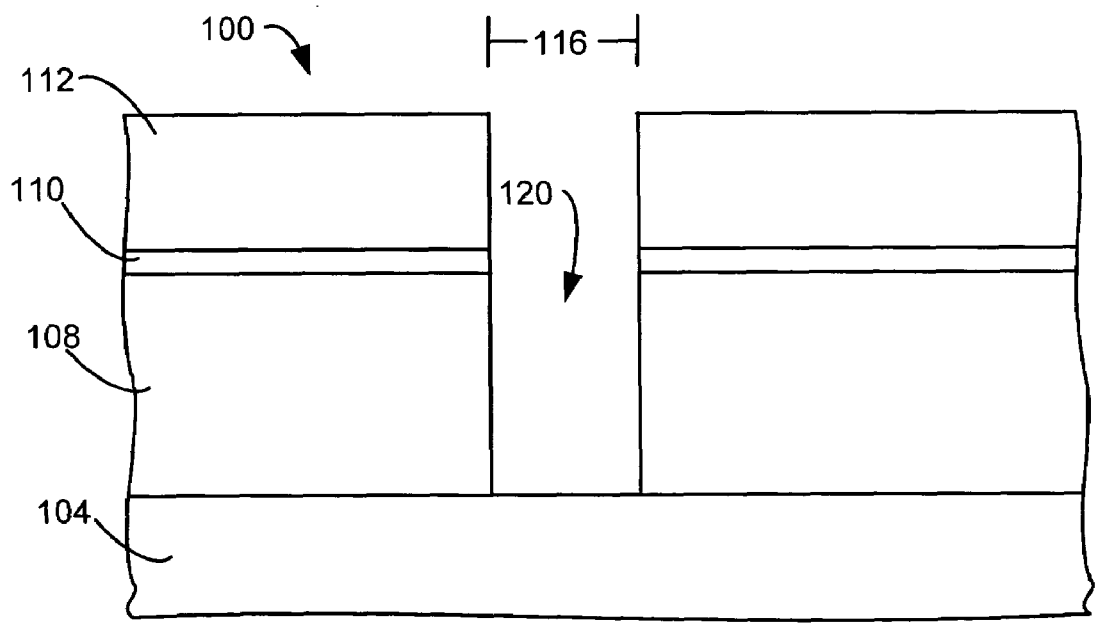
Figure 2:
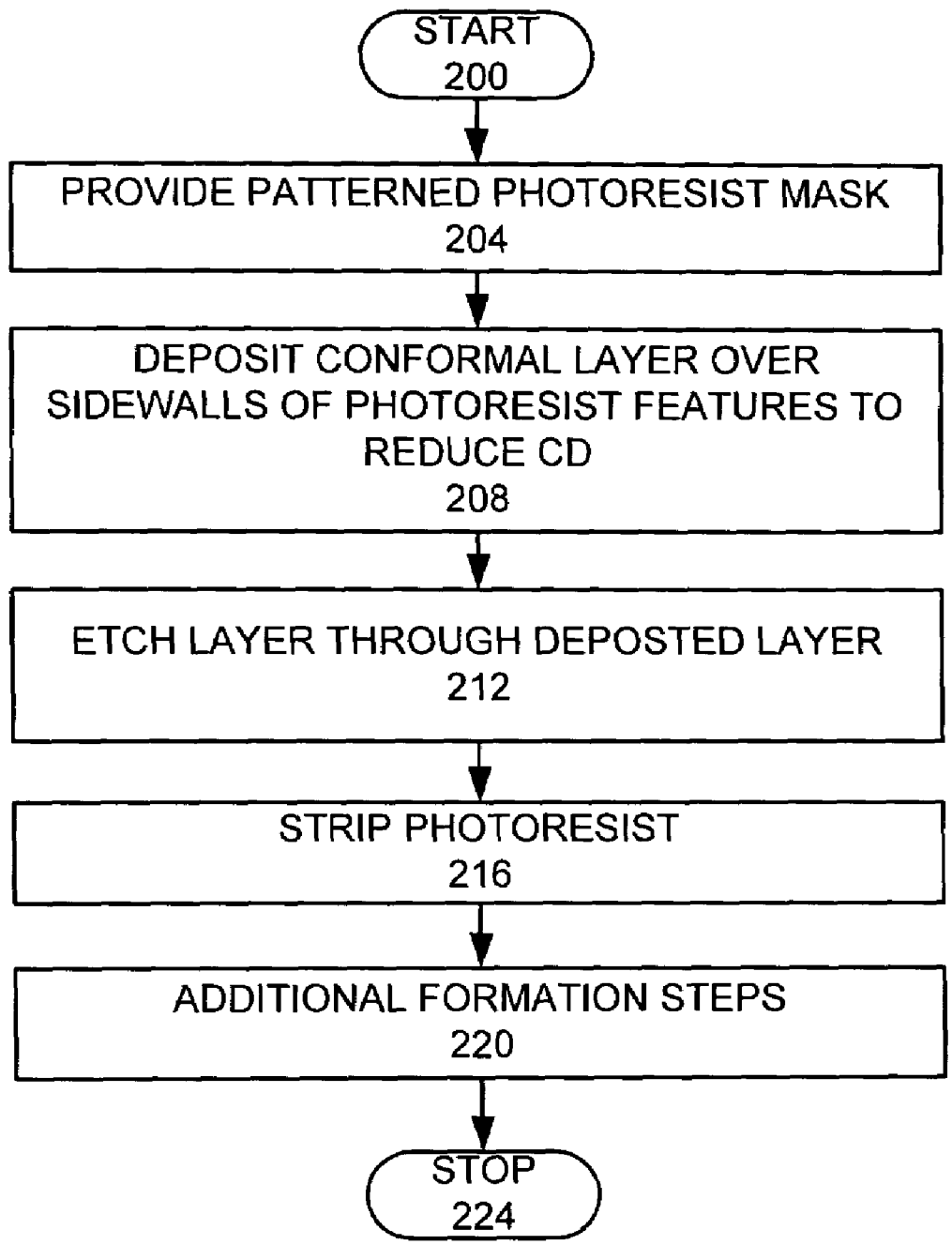
FIG. 2 is a high level flow chart of a process that may be used in an embodiment of the invention.
Figure 3A:
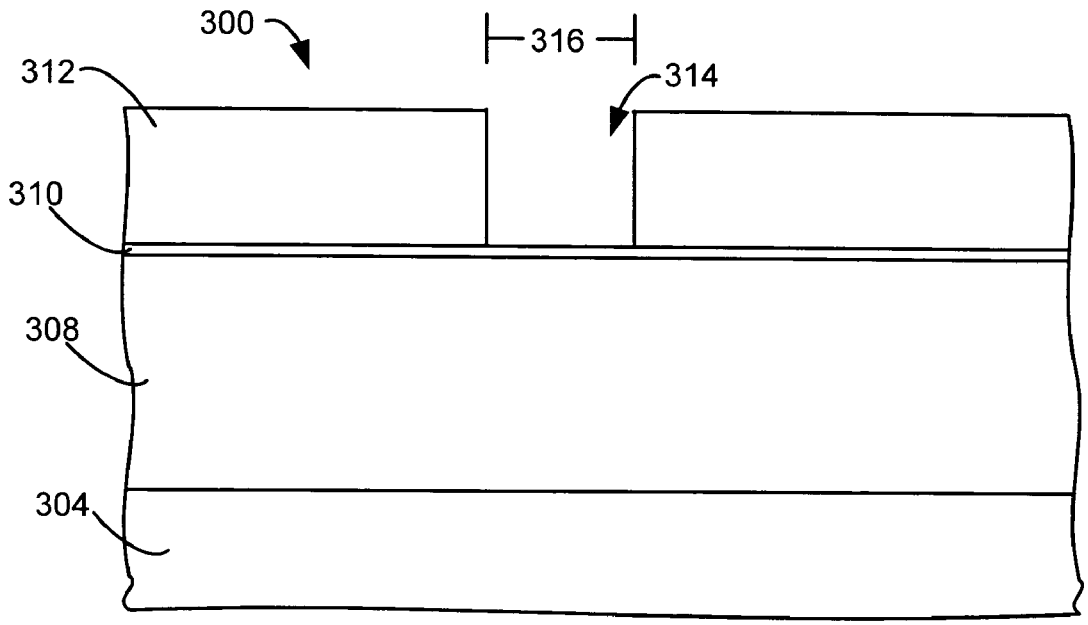
FIGS. 3A-D are schematic cross-sectional views of a stack processed according to an embodiment of the invention.

To facilitate understanding, FIG. 2 is a high level flow chart of a process that may be used in an embodiment of the invention. A patterned photoresist mask is provided (step 204). FIG. 3A is a schematic cross-sectional view of a layer to be etched 308 over a substrate 304, with a patterned photoresist mask 312 with a feature 314, over a ARL 310, over the layer 308 to be etched forming a stack 300. The photoresist mask has a photoresist feature critical dimension (CD), which may be the widest part of the width 316 of the smallest possible feature. Presently, for 248 nm photoresist a typical CD for the photoresist may be 230-250 nm, using conventional processes.

Figure 3B:
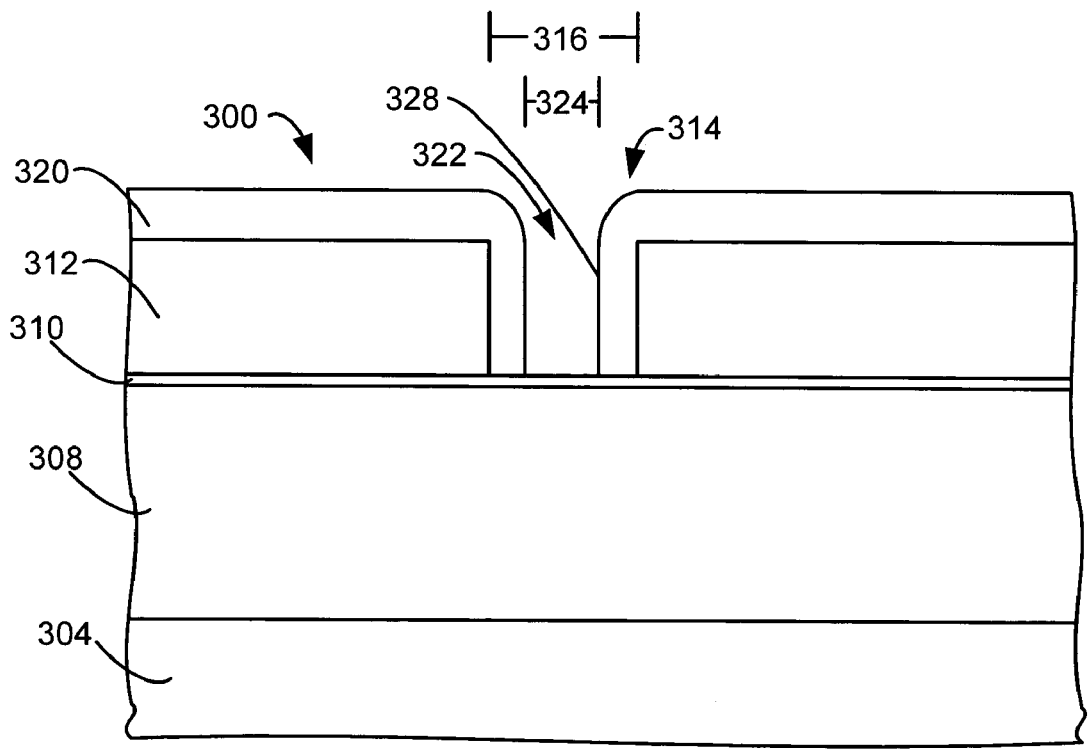

A layer is then deposited over the sidewalls of the photoresist features to reduced the CD (step 208). FIG. 3B is a schematic cross-sectional view of the patterned photoresist mask 312 with a layer 320 deposited over the sidewalls of the feature 314. The deposited layer 320 forms a deposited layer feature 322 within the photoresist feature 314, where the deposited layer feature 322 has a reduced CD 324 that is less than the CD 316 of the photoresist feature 314. Preferably, the reduced CD 324 of the deposited layer feature 322 is at least 30% less than the CD 316 of the photoresist feature (i.e. not greater than 70% of the CD 316 of the photoresist feature). More preferably, the reduced CD 324 of the deposited layer feature 322 is at least 40% less than the CD 316 of the photoresist feature (i.e. not greater than 60% of the CD 316 of the photoresist feature). Most preferably, the reduced CD 324 of the deposited layer feature 322 is at least 50% less than the CD 316 of the photoresist feature (i.e. not greater than 50% of the CD 316 of the photoresist feature). For example, the deposited layer feature may have a reduced CD 316 that is 99% less than the CD 316 of the photoresist feature. It is also desirable that the deposited layer feature 322 has substantially vertical sidewalls 328, which are highly conformal as shown. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a bread-loafing formation, which provide non-substantially vertical sidewalls. Tapered sidewalls (from the faceting formation) or bread-loafing sidewalls may increase the deposited layer CD and provide a poor etching mask. Preferably, the deposition on the side wall is thicker than the deposition on the bottom of the photoresist feature. More preferably, no layer is deposited over the bottom of the photoresist feature.

Figure 3C:
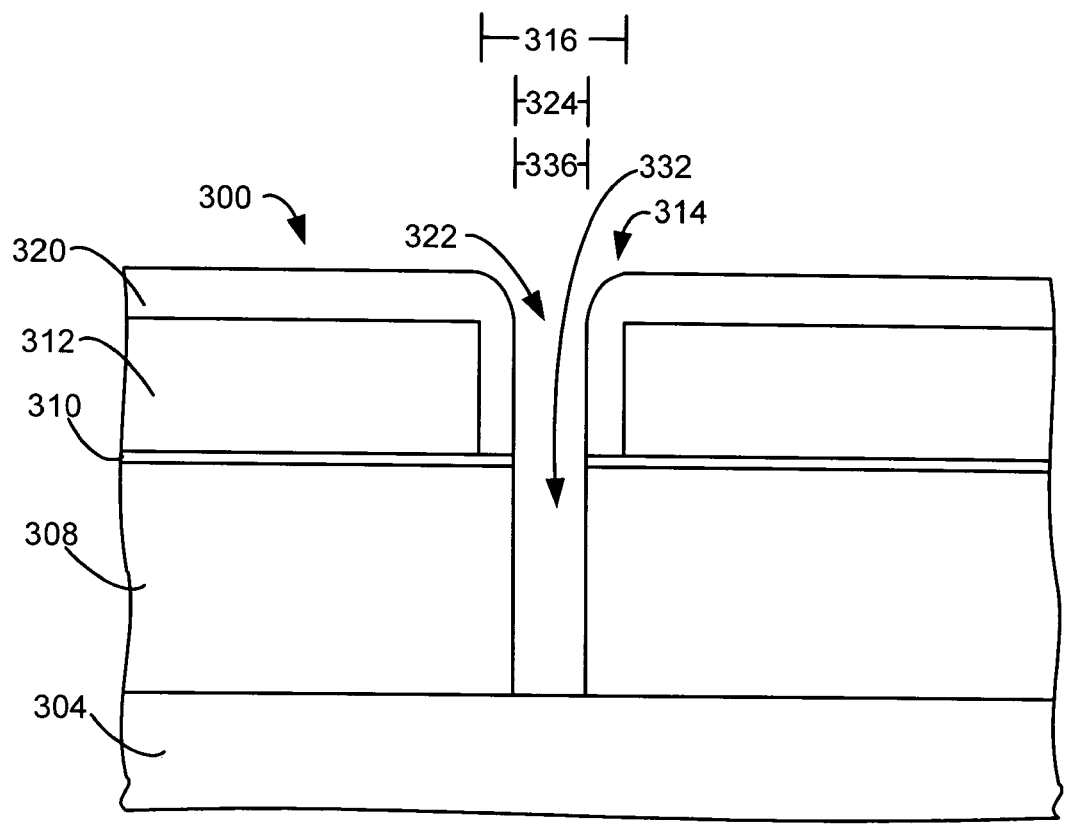

Features are then etched into the layer to be etched 308 through the deposited layer features 322 (step 212). FIG. 3C shows a feature 332 etched into the layer to be etched 308. In this example, the feature 332 etched in the layer to be etched 308 has a CD 336, which is equal to the CD 324 of the deposited layer feature 322. In practice, the CD 336 of the feature 332 may be slightly larger than the CD 324 of the feature 322 of the deposited layer 320. However, since the CD 324 of the deposited layer feature 322 is significantly smaller than the CD 316 of the photoresist 312, the CD 336 of the feature 332 in the layer to be etched 308 is still smaller than the CD 316 of the photoresist 312. If the CD 324 of the deposited layer was only slightly smaller than the CD of the photoresist, or if the deposited layer was faceted or bread loafed, then the CD of the layer to be etched might not be smaller than the CD of the photoresist. In addition, a faceted or bread-loafing deposited layer may cause a faceted or irregularly shaped feature in the layer to be etched. It is also desirable to minimize deposition on the bottom of the photoresist feature. Preferably, the CD 336 of the feature 332 etched in the layer to be etched 308 is at least 30% less than the CD 316 of the photoresist feature. More preferably, the CD 336 of the feature 332 etched in the layer to be etched 308 is at least 40% less than the CD 316 of the photoresist feature. Most preferably, the CD 336 of the feature 332 etched in the layer to be etched 308 is at least 50% less than the CD 316 of the photoresist feature.

Figure 3D:
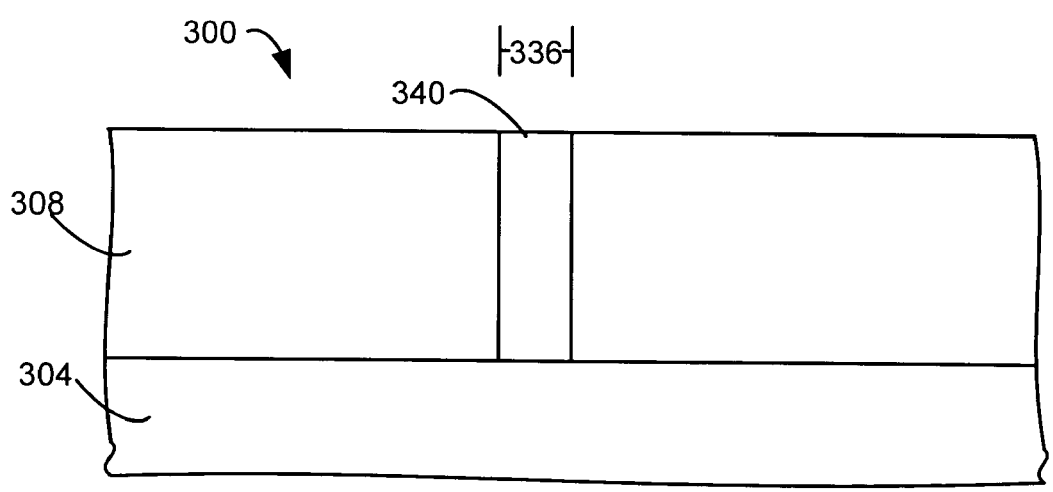

The photoresist and deposited layer may then be stripped (step 216). This may be done as a single step or two separate steps with a separate deposited layer removal step and photoresist strip step. Ashing may be used for the stripping process. FIG. 3D shows the stack 300 after the deposited layer and photoresist mask have been removed. Additional formation steps may be performed (step 220). For example, a contact 340 may then be formed in the feature. To provide a dual damascene structure, a trench may be etched before the contact is formed. Additional processes may be performed after the contact is formed.

Figure 4:
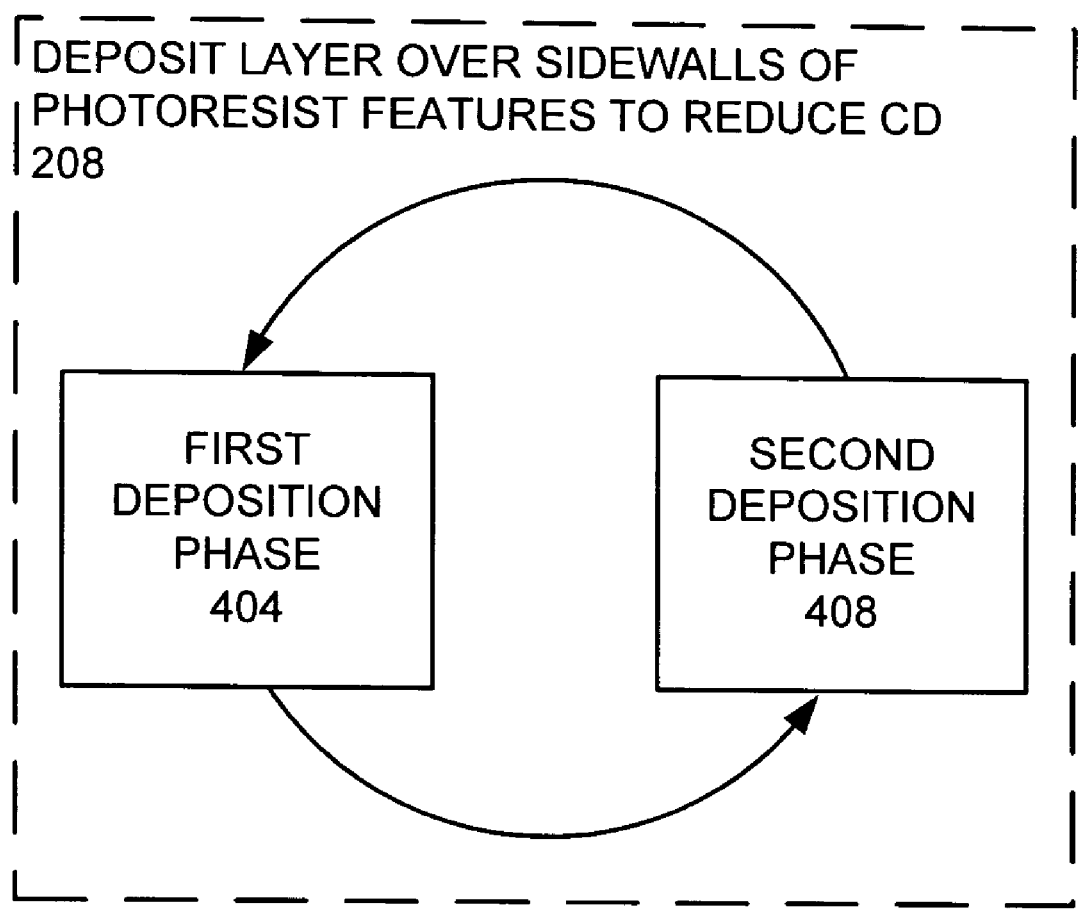
FIG. 4 is a more detailed flow chart of the step of depositing a layer over sidewalls of photoresist features to reduce CD.

FIG. 4 is a more detailed flow chart of the deposit layer over sidewalls of photoresist features to reduce CD step 208. In the embodiment, the deposit layer over sidewalls of photoresist features to reduce CD step 208 comprises a first deposition phase 404 and a second deposition phase 408.

EXAMPLE OF DIELECTRIC ETCH

Figure 5:
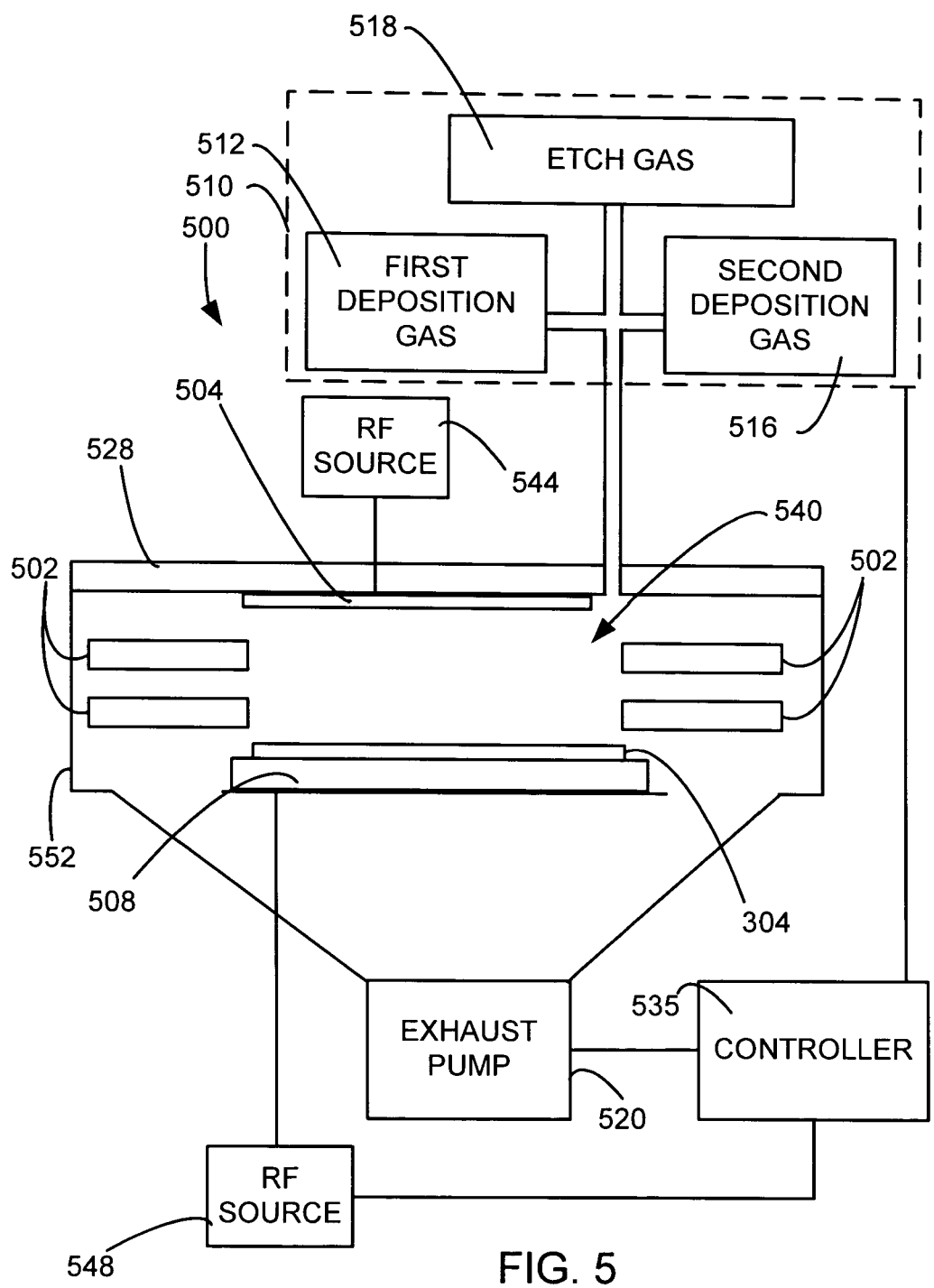
FIG. 5 is a schematic view of a plasma processing chamber that may be used in practicing the invention.

FIG. 5 is a schematic view of a plasma processing chamber 500 that may be used for depositing the layer, etching, and stripping. The plasma processing chamber 500 comprises confinement rings 502, an upper electrode 504, a lower electrode 508, a gas source 510, and an exhaust pump 520. The gas source 510 comprises a first deposition gas source 512 and a second deposition gas source 516. The gas source 510 may comprise additional gas sources, such as an etching gas source 518. Within plasma processing chamber 500, the substrate 304 is positioned upon the lower electrode 508. The lower electrode 508 incorporates a suitable substrate chucking mechanism (e.g., electrostatic, mechanical clamping, or the like) for holding the substrate 304. The reactor top 528 incorporates the upper electrode 504 disposed immediately opposite the lower electrode 508. The upper electrode 504, lower electrode 508, and confinement rings 502 define the confined plasma volume. Gas is supplied to the confined plasma volume by the gas source 510 and is exhausted from the confined plasma volume through the confinement rings 502 and an exhaust port by the exhaust pump 520. A first RF source 544 is electrically connected to the upper electrode 504. A second RF source 548 is electrically connected to the lower electrode 508. Chamber walls 552 surround the confinement rings 502, the upper electrode 504, and the lower electrode 508. Both the first RF source 544 and the second RF source 548 may comprise a 27 MHz power source and a 2 MHz power source. Different combinations of connecting RF power to the electrode are possible. In the case of Exelan HPT™, which is basically the same as an Exelan HP with a Turbo Pump attached to the chamber, made by LAM Research Corporation™ of Fremont, Calif., which may be used in a preferred embodiment of the invention, both the 27 MHz and 2 MHz power sources make up the second RF power source 548 connected to the lower electrode, and the upper electrode is grounded. A controller 535 is controllably connected to the RF sources 544, 548, exhaust pump 520, and the gas source 510. The Exelan HPT would be used when the layer to be etched 308 is a dielectric layer, such as silicon oxide or organo silicate glass.

Figure 11A:
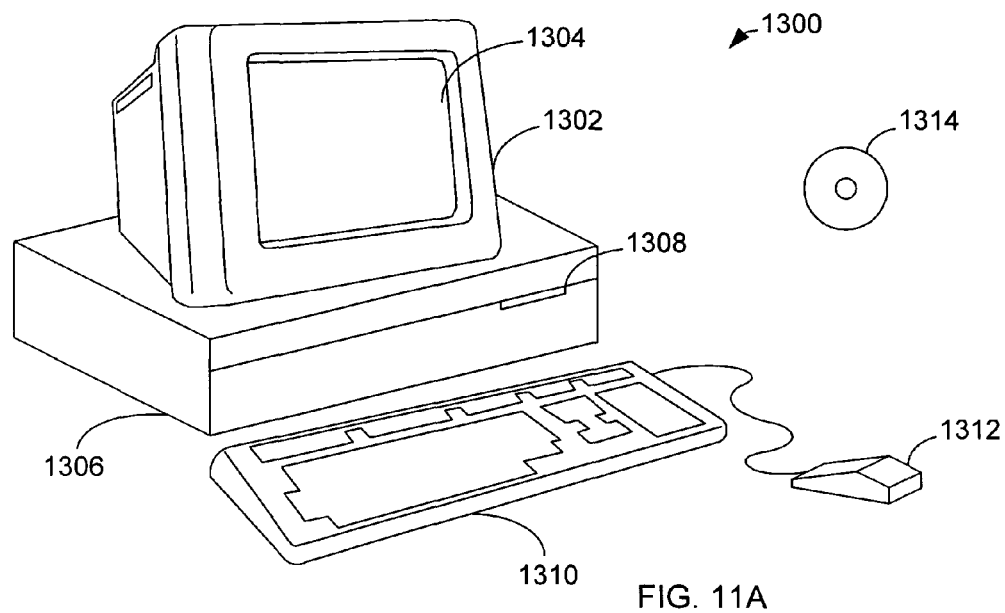
FIGS. 11A-B illustrate a computer system, which is suitable for implementing a controller used in embodiments of the present invention.
Figure 11B:
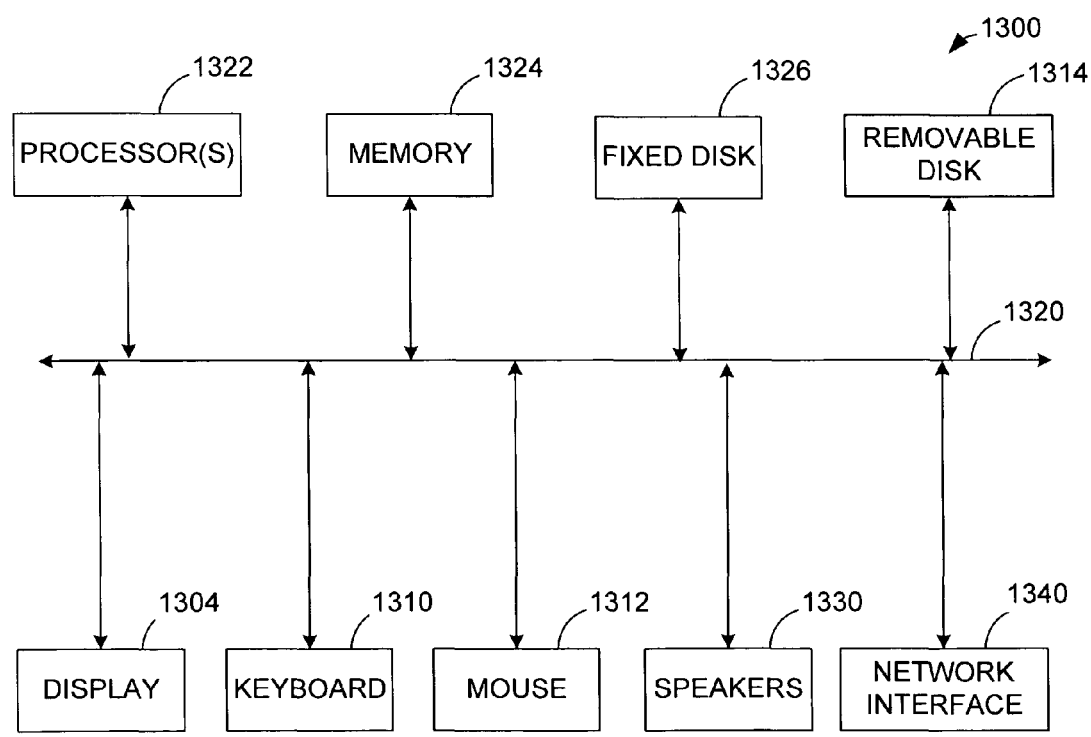

FIGS. 11A and 11B illustrate a computer system 1300, which is suitable for implementing a controller 535 used in embodiments of the present invention. FIG. 11A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 11B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324.

Removable disk 1314 may take the form of any of the computer-readable media described below.

CPU 1322 is also coupled to a variety of input/output devices, such as display 1304, keyboard 1310, mouse 1312 and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Other examples may use other deposition devices.

One example of a first deposition phase 404 may be $CH_3F$ deposition using a chemistry of 250 sccm (standard cubic centimeters per minute) Ar and 50 sccm $CH_3F$, at a pressure of 60 mTorr, established by setting a Vat valve of the turbo pump to 1000. The 27 MHz RF source provides 500 Watts of power, while the 2 MHz RF source provides 100 Watts of power. The chamber temperature is maintained at 20° C. A helium cooling pressure, to cool the substrate is 15 Torr.

One example of a second deposition phase 408 may be $C_4F_6/O_2/CO$ deposition using a chemistry of 270 sccm Ar, 12 sccm $C_4F_6$, 8 sccm $O_2$, and 100 sccm CO, at a pressure of 50 mTorr, established by setting a Vat valve of the turbo pump to 1000. The 27 MHz RF source provides 1500 Watts of power, while the 2 MHz RF source provides 480 Watts of power. The chamber temperature is maintained at 20° C. A helium cooling pressure, to cool the substrate is 15 Torr.

Figure 6:
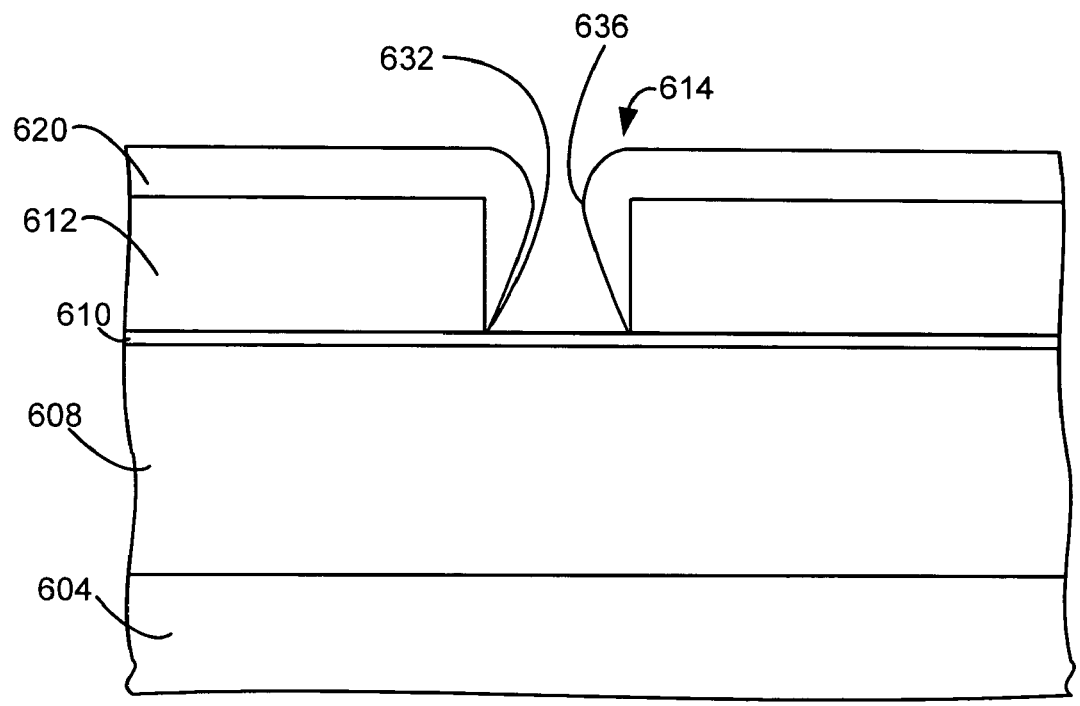
FIG. 6 is a schematic cross-sectional view of a deposition layer where only a first deposition phase deposition is used for an entire deposition layer.

FIG. 6 is a schematic cross-sectional view of a deposition layer 620 where only the first deposition phase deposition is used for an entire deposition layer 620. The deposition layer 620 is formed over a photoresist mask 612, over an ARL 610, over a layer to be etched 608, over a substrate 604. The photoresist mask 612 forms a feature 614. In this example, the first deposition forms a "bread-loafing" deposition layer. The bread-loafing deposition layer is characterized by a thicker sidewall deposition 632 near the top of the feature and a thinner (or no) sidewall deposition 636 near the bottom of the feature. Therefore, this deposition provides a non-conformal sidewall deposition. Such a deposition does not provide the desired substantially vertical sidewalls. The bread-loafing eventually pinches off the top, which then cannot be used as a masking layer, since the contact will be closed off and no etching can be done.

Figure 7:
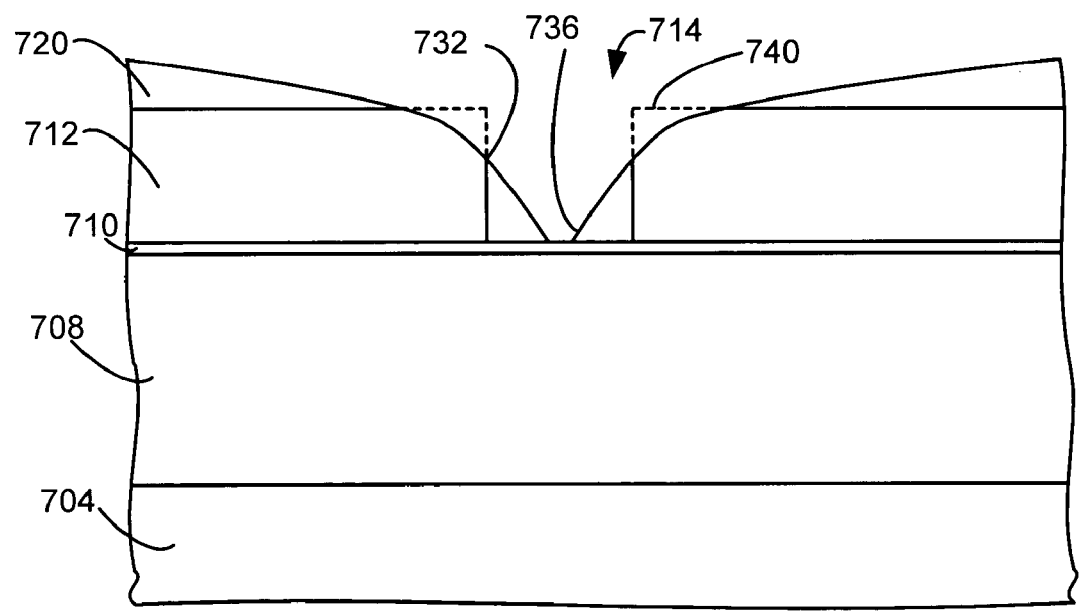
FIG. 7 is a schematic cross-sectional view of a deposition layer where only the second deposition phase deposition is used for an entire deposition layer.

FIG. 7 is a schematic cross-sectional view of a deposition layer 720 where only the second deposition phase deposition is used for an entire deposition layer 720. The deposition layer 720 is formed over a photoresist mask 712, over an ARL 710, over a layer to be etched 708, over a substrate 704. The photoresist mask 712 forms a feature 714. In this example, the first deposition forms a "faceting" deposition layer. The faceting deposition layer is characterized by a thinner (or no) sidewall deposition 732 near the top of the feature and a thicker sidewall deposition 736 near the bottom of the feature. Therefore, this deposition also provides a non-conformal sidewall deposition. If the sidewalls near the top are too thin, faceting 740 of the photoresist mask 712 may result. Such a deposition does not provide the desired substantially vertical sidewalls. The faceting of the corners of the photoresist mask may cause lower etch selectivity and fast mask erosion. The faceting of the mask will also result in faceting of the etched profile. In almost all cases, once the mask is faceted, then the final etched profile is also faceted, since the mask vertical profile generally translates into the etched material.

Therefore in an example of a preferred embodiment of the invention, the first deposition phase 404 and the second deposition phase 408 in the example above are alternated for 6 cycles, where the first deposition phase 404 is for 2 seconds and the second deposition phase 408 is for 25 seconds. Such a deposition would have a first deposition of the first deposition phase 404, and then a second deposition of the second deposition phase 408, then a third deposition of the first deposition phase 404, then a fourth deposition of the second deposition phase 408, which is repeated until there is a twelfth deposition.

Figure 8:
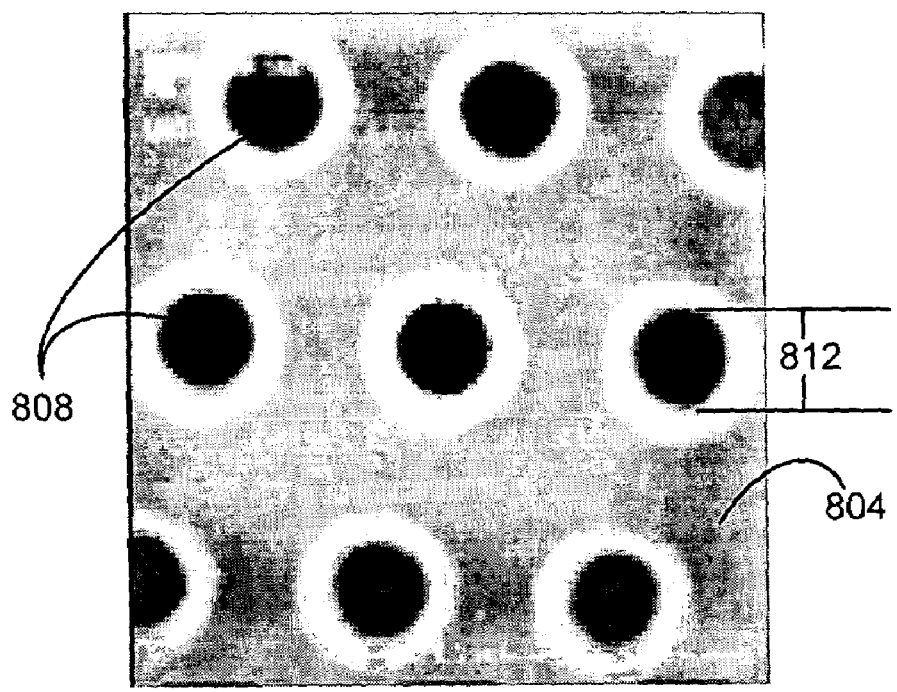
FIG. 8 is a top view of a photoresist etch mask using 248 nm photoresist.

FIG. 8 is a top view of a photoresist etch mask 804 using 248 nm photoresist. The photoresist etch mask 804 has a plurality of photoresist features 808. In this example, the photoresist features 808 have a CD 812 of 206 nm. In this example, the CD 812 is the diameter of the photoresist feature.

Figure 9:
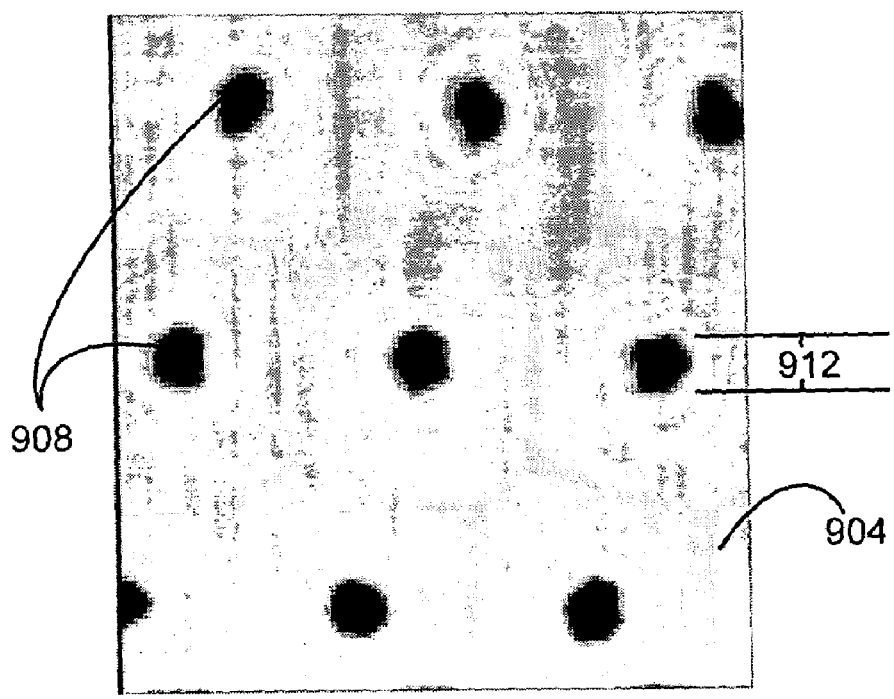
FIG. 9 is a top view of a deposition layer that has been deposited over the photoresist etch mask.

FIG. 9 is a top view of a deposition layer 904 that has been deposited over the photoresist etch mask using the above described example. The deposition layer 904 has plurality of features 908, located within the plurality of photoresist features. The features 908 have a CD 912 that was measured, in this example, to be 115 nm, which is 56% of the CD 812 of the photoresist feature, so that the CD 912 of the deposited layer feature is 44% less than the CD 812 of the photoresist feature. In this example, the CD is the diameter of the feature.

Figure 10:
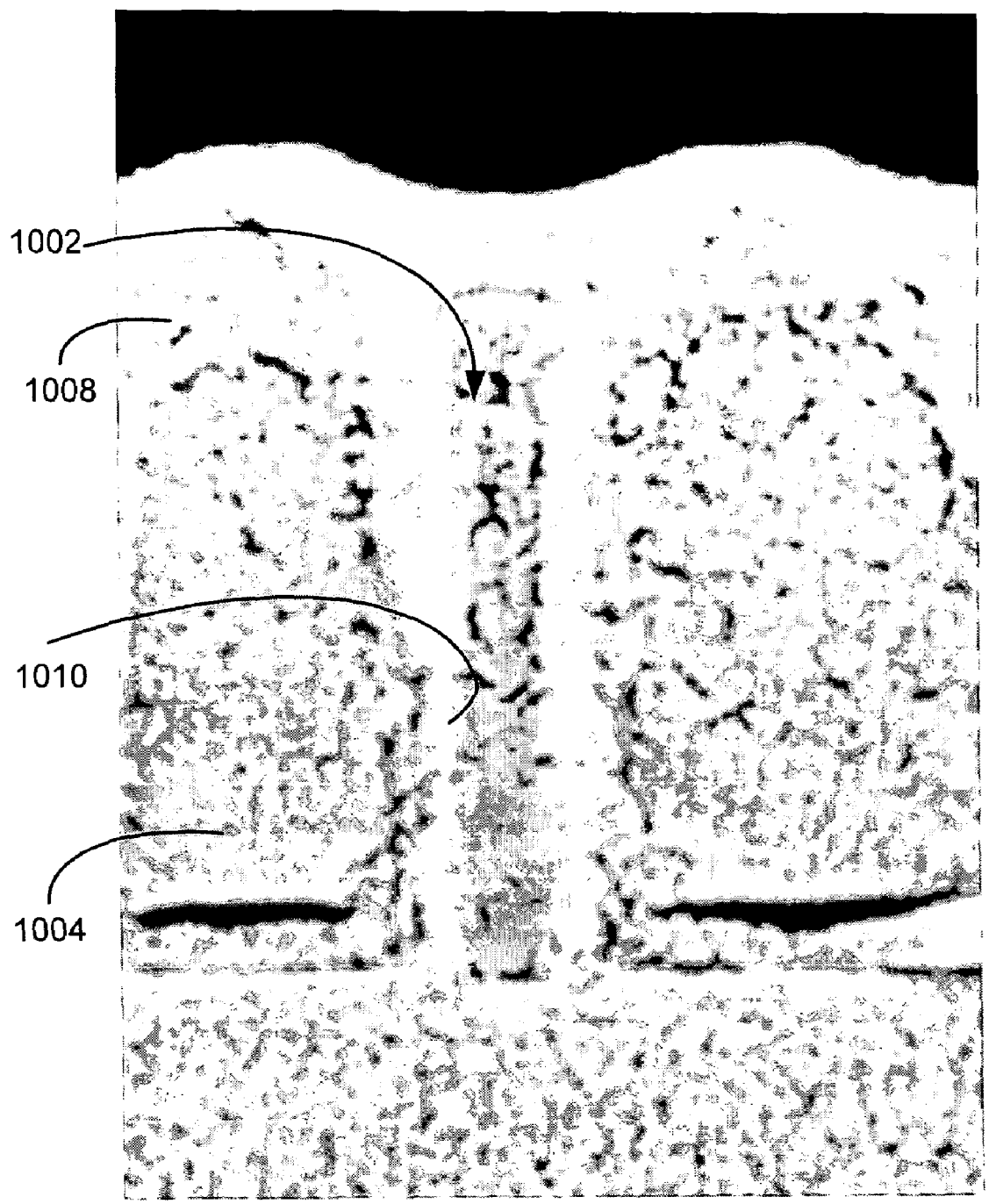
FIG. 10 is a cross-sectional view of a feature in a photoresist mask covered with a deposition layer.

FIG. 10 is a cross-sectional view of a feature 1002 in a photoresist mask 1004 covered with a deposition layer 1008. As shown, the feature 1002 has substantially vertical sidewalls 1010, so that the width of the feature is substantially the same along the length of the feature 1002. In addition, the layer on the sidewalls is highly conformal, so that the layer has a uniform thickness from the top to the bottom of the feature.

Figure 12:
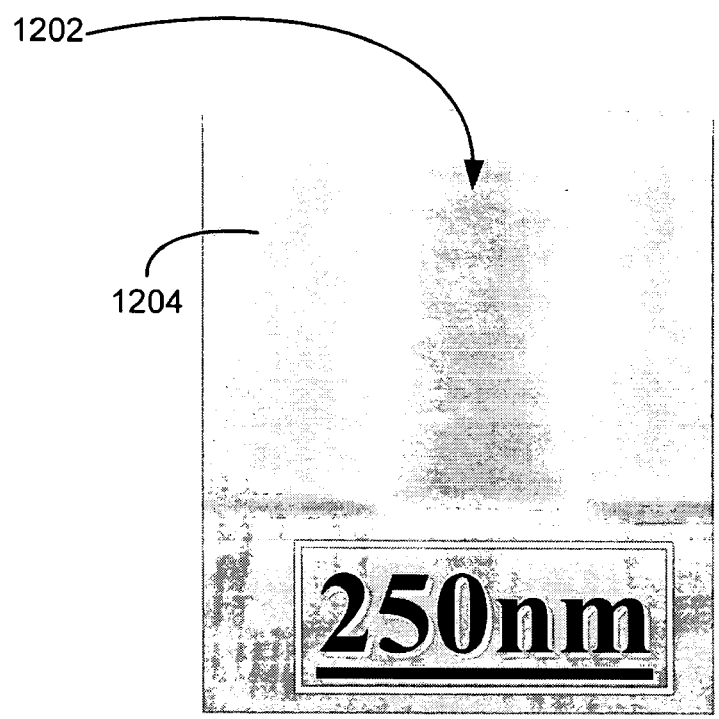
FIG. 12 is a cross-sectional view of a feature in a photoresist mask formed using a 248 nm photoresist.
Figure 13:
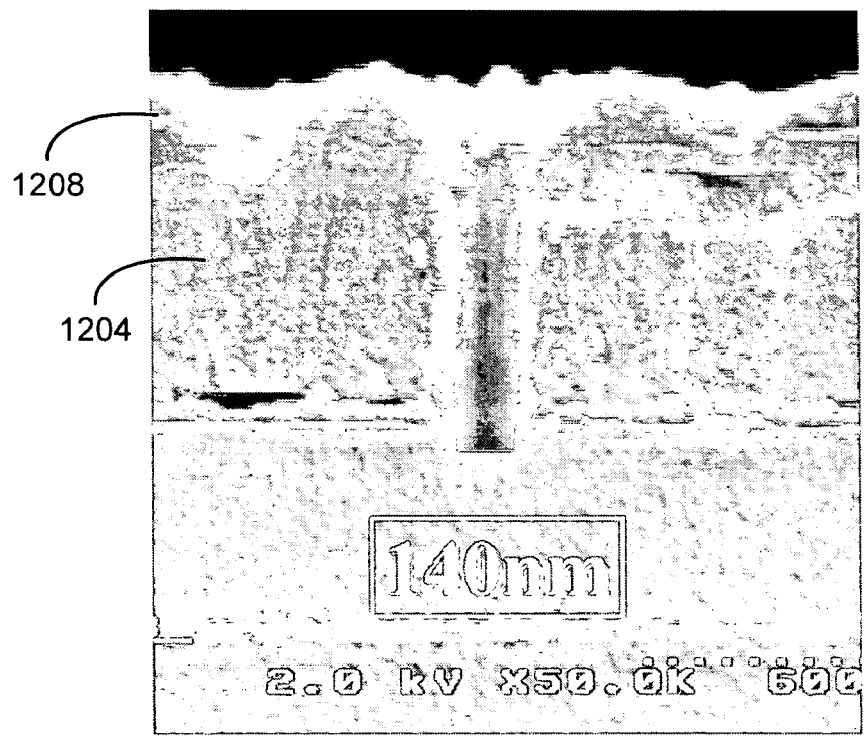
FIG. 13 is a cross-sectional view of the feature in the photoresist mask covered with a deposition layer.
Figure 14:
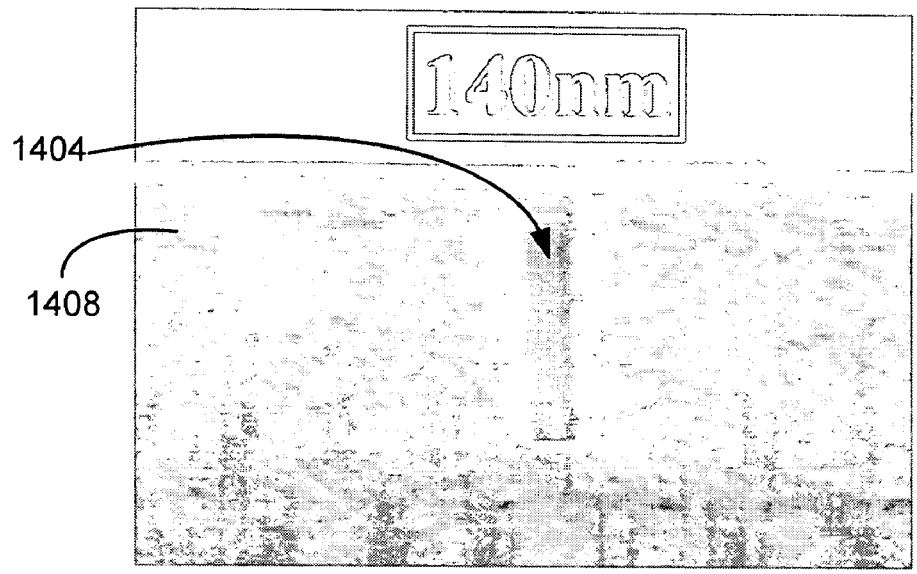
FIG. 14 is a cross-sectional view of a feature etched into the layer below the photoresist through the feature in the deposition layer, after the deposition layer and photoresist layer has been stripped.

FIG. 12 is a cross-sectional view of a feature 1202 in a photoresist mask 1204 formed using a 248 nm photoresist. In this example the photoresist feature has a CD of 250 nm. A two phase deposition is used to provide a deposition layer over the sidewalls of the photoresist mask 1204. The two phase deposition may use a different recipe than the previous example. FIG. 13 is a cross-sectional view of the feature 1202 in the photoresist mask 1204 covered with a deposition layer 1208. The CD of the feature in the deposition layer 1208 is 140 nm. The feature in the deposition layer 1208 is used to etch a layer below the photoresist. FIG. 14 is a cross-sectional view of a feature 1404 etched into the layer 1408 below the photoresist through the feature in the deposition layer, after the deposition layer and photoresist layer has been stripped. The CD of the feature 1404 is 140 nm.

The ability to control the ratio of etch times of the first deposition phase 404 and the second deposition phase 408 provide another control variable. A proper ratio will provide substantially vertical and conformal sidewalls as illustrated in FIG. 3B. Such a deposition layer is also able to protect the photoresist mask to increase etch selectivity. Other control parameters provided by the invention that can be used to control the deposition profiles are: number of cycles, total deposition time, depostion1/deposition2 time ratio, gas chemistry ratio (such as $CH_3F/O_2$ ratio or $C_4F_6/O_2$ ratio). Other gas chemistries such as $CH_2F_2$ instead of $CH_3F$ or $C_4F_8$ instead of $C_4F_6$, etc. may be used.

The ability to form features with smaller critical dimensions, without changing the photoresist, allows for smaller features without purchasing new lithography equipment. In newer generations of photoresist are used, the invention provides small CD's for the newer generations of photoresist.

In other embodiments, three or more different gas chemistries may be used providing three or more different deposition phases.

EXAMPLE OF CONDUCTIVE LAYER ETCH

Figure 15:
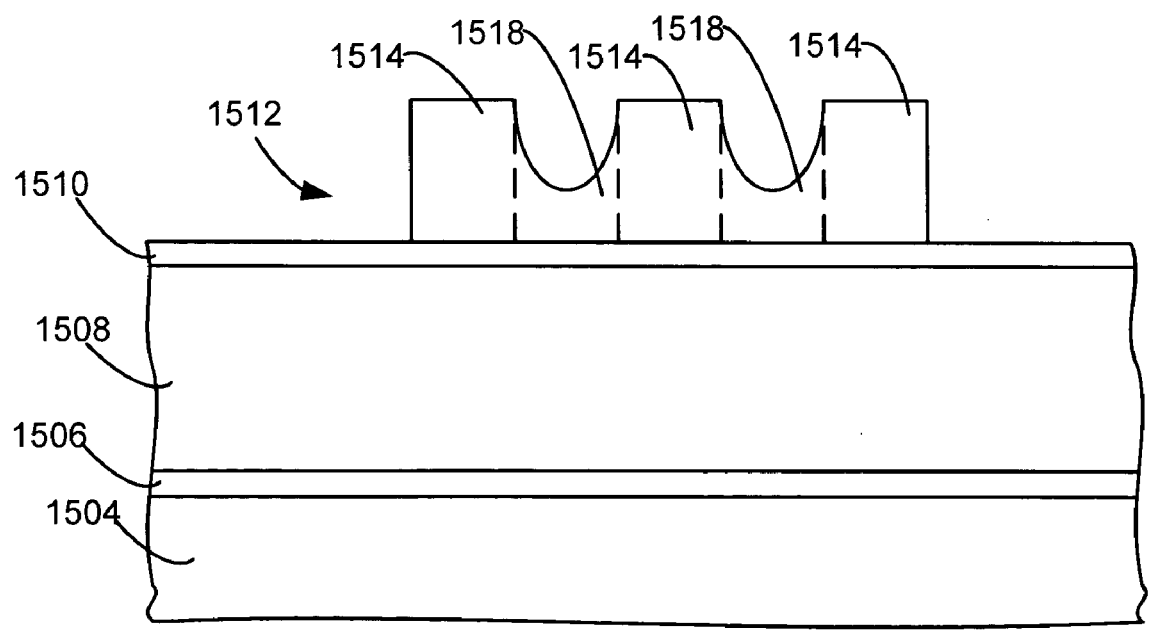
FIGS. 15A-C are cross-sectional views of photoresist masks for producing conductive lines, according to the prior art.
Figure 15:
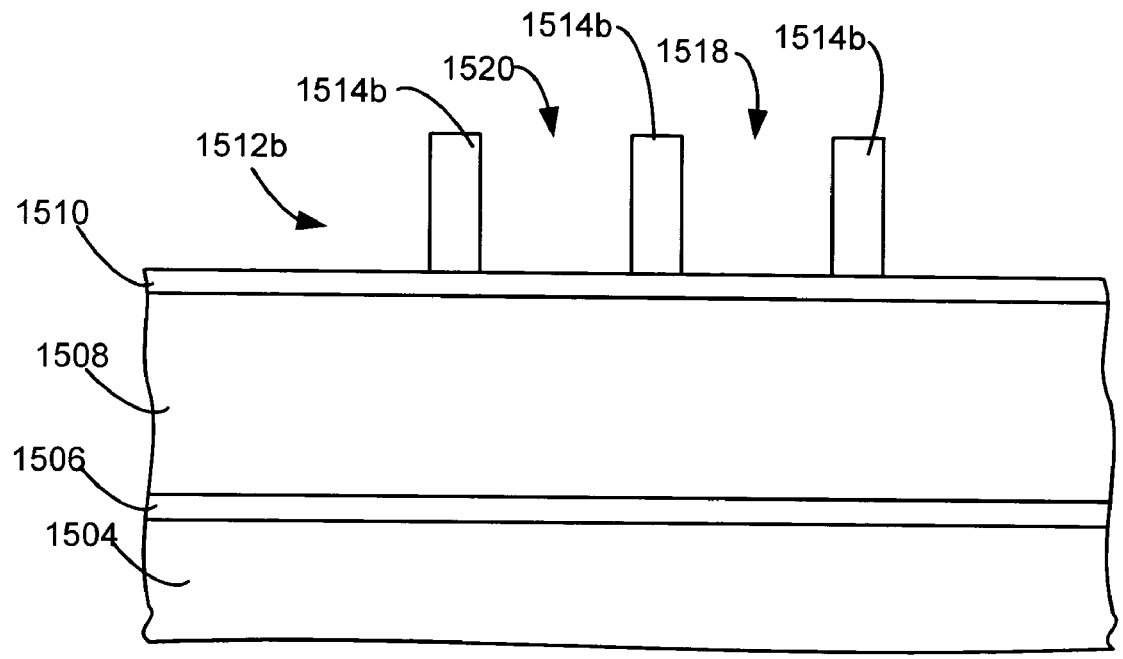
Figure 15:
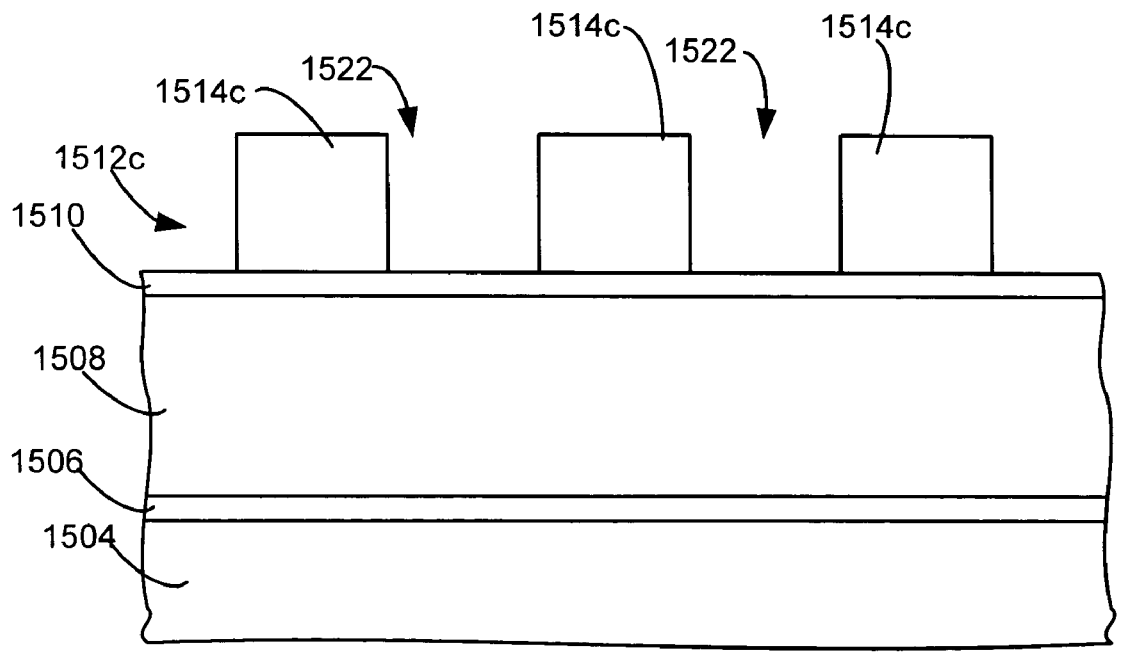

In the formation of conductive lines, such as metal connectors or memory devices like flash memory, it is desirable to increase the thickness of the conductive lines and/or decrease the CD of the spacing between the conductive lines. FIG. 15A is a cross-sectional view of a photoresist mask for producing conductive lines, when spacing between the lines is too close according to the prior art. Over a substrate 1504, such as a wafer a barrier layer 1506 may be placed. Over the barrier layer 1506 a conductive layer 1508 such as a metal layer or a polysilicon layer is formed. Over the conductive layer 1508 an antireflective layer (ARL) 1510 such as a DARC layer is formed. A photoresist mask 1512 is formed over the ARL 1510. In this example, the photoresist mask 1512 forms line masks 1514 with photoresist residue 1518 formed in spaces between the line masks 1514. The presence of the photoresist residue 1518 is caused by providing too small of a space between the line masks 1514, since it is more difficult to remove residue from a small space. This may limit the density of the conductive lines that may be provided.

FIG. 15B is another cross-sectional view of a photoresist mask 1512b for producing conductive lines, used in the prior art to attempt to overcome the problem created by too small spacing. The line masks 1514b in this example are made thinner to allow wider spaces 1520 to prevent resist residue and maintain the same pitch or density as the previous example. One of the drawbacks of this approach is that thinner line masks 1514b result in thinner lines. The thinner lines may result in less reliability and poorer performance. The thinner lines may result in smaller transistor areas, which may cause a short channel effect and other performance problems, such as short channel effect and high wordline resistance (causing a slower speed)).

FIG. 15C is another cross-sectional view of a photoresist mask 1512c for producing conductive lines, used in the prior art to attempt to overcome the problem created by too small spacing. In some applications, it is desirable that the line masks 1514c have the same width as the spaces 1522. Since in this example, the spaces 1522 are made wider to prevent resist residue, the line masks 1514c are also wider. As a result, the pitch is increased and the density of the lines is decreased.

It is desirable to provide more densely placed conductive lines by reducing spacing between lines while maintaining wider line widths.

Figure 16A:
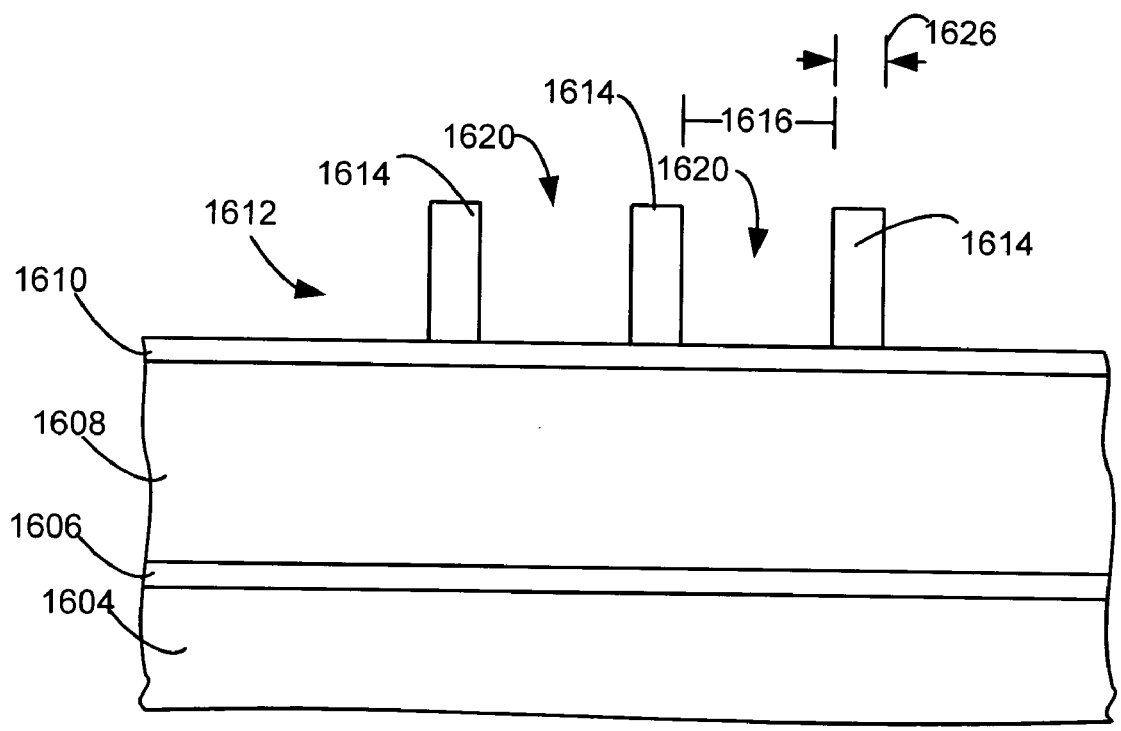
FIGS. 16A-E are schematic cross-sectional views of a conductive layer processed according to an embodiment of the invention.

The high level process shown in FIG. 2 will be used to facilitate the understanding of this embodiment of the invention. A patterned photoresist mask is provided (step 204). FIG. 16A is a schematic cross-sectional view of a conductive layer to be etched 1608 over a barrier layer 1606 over a substrate 1604, with a patterned photoresist mask 1612 forming mask lines 1614, with mask spaces 1620 therebetween, over an ARL 1610, over the conductive layer 1608 to be etched. The photoresist mask has a space critical dimension (CD), which is the width 1616 of the space, and a line CD, which is the width 1626 of the mask lines 1614. Presently, for 248 nm photoresist a typical CD for the space width CD is 0.16 um. Generally, the width of the space in the photoresist is made wide enough to provide the formation of the space in the photoresist without photoresist residue in the space. The width of the photoresist mask lines is thin enough to provide an increase density of conductive lines.

Figure 16B:
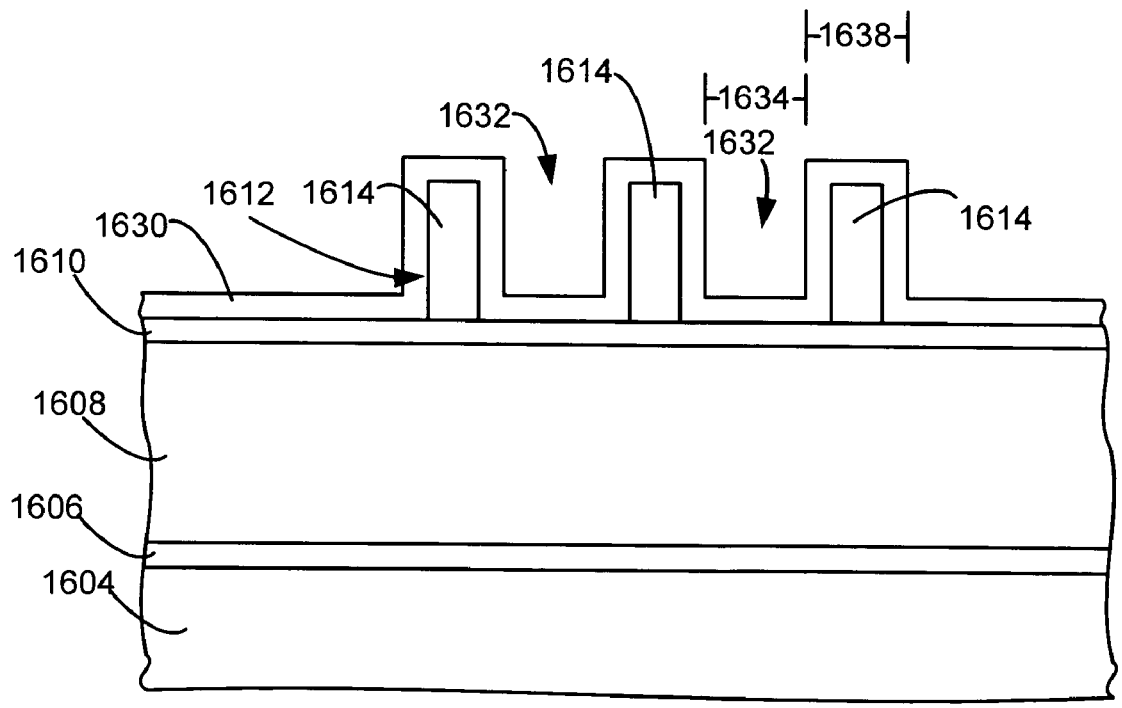

A conformal layer is then deposited over the sidewalls of the photoresist features to reduced the width of the space (step 208). FIG. 16B is a schematic cross-sectional view of the patterned photoresist mask 1612 with a layer 1630 deposited over the sidewalls of the mask 1612. The deposited layer 1630 forms a deposited layer space 1632 within the mask space, where the deposited layer space 1632 has a reduced width (CD) 1634 that is less than the width 1616 of the mask space. In addition, the deposited layer 1630 forms deposited layer mask lines with a width 1638 that is greater than the width 1626 of the mask lines 1614. Preferably, the reduced width 1634 of the deposited layer space 1632 is at least 20% less than the width 1616 of the mask space 1620 (i.e. not greater than 80% of the width 1616 of the mask space 1620). More preferably, the reduced width 1634 of the deposited layer space 1632 is at least 50% less than the width 1616 of the mask space 1620 (i.e. not greater than 50% of the width 1616 of the mask space 1620). Most preferably, the reduced width 1616 of the deposited layer space 1632 is at least 70% less than the width 1634 of the mask space 1620 (i.e. not greater than 30% of the width 1616 of the mask space 1620). It is also desirable that the deposited layer forms substantially vertical sidewalls 1642, which are highly conformal as shown. An example of a substantially vertical sidewall is a sidewall that from bottom to top makes an angle of between 88° to 90° with the bottom of the space. Conformal sidewalls have a deposition layer that has substantially the same thickness from the top to the bottom of the space. This process for a conductive layer etch is able to provide a conformal layer in a single deposition.

Figure 17:
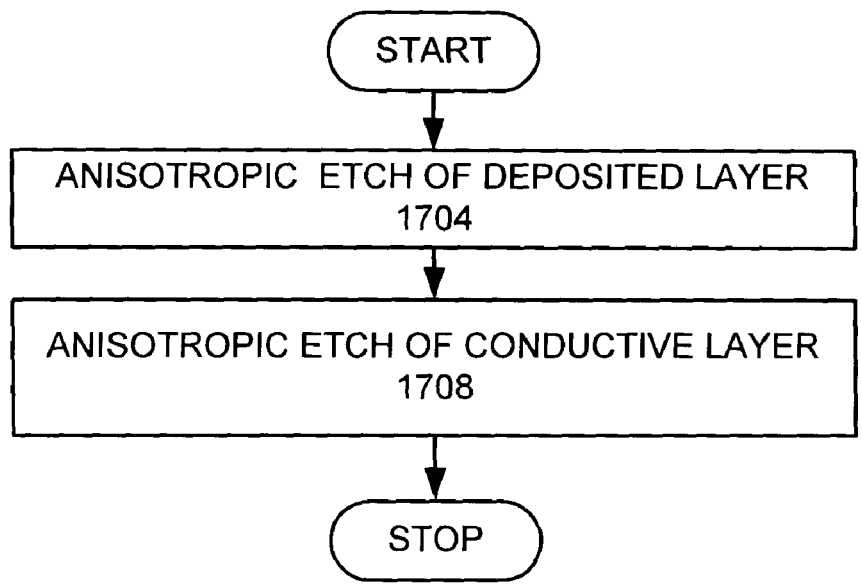
FIG. 17 is a flow chart of an etch step.
Figure 16C:
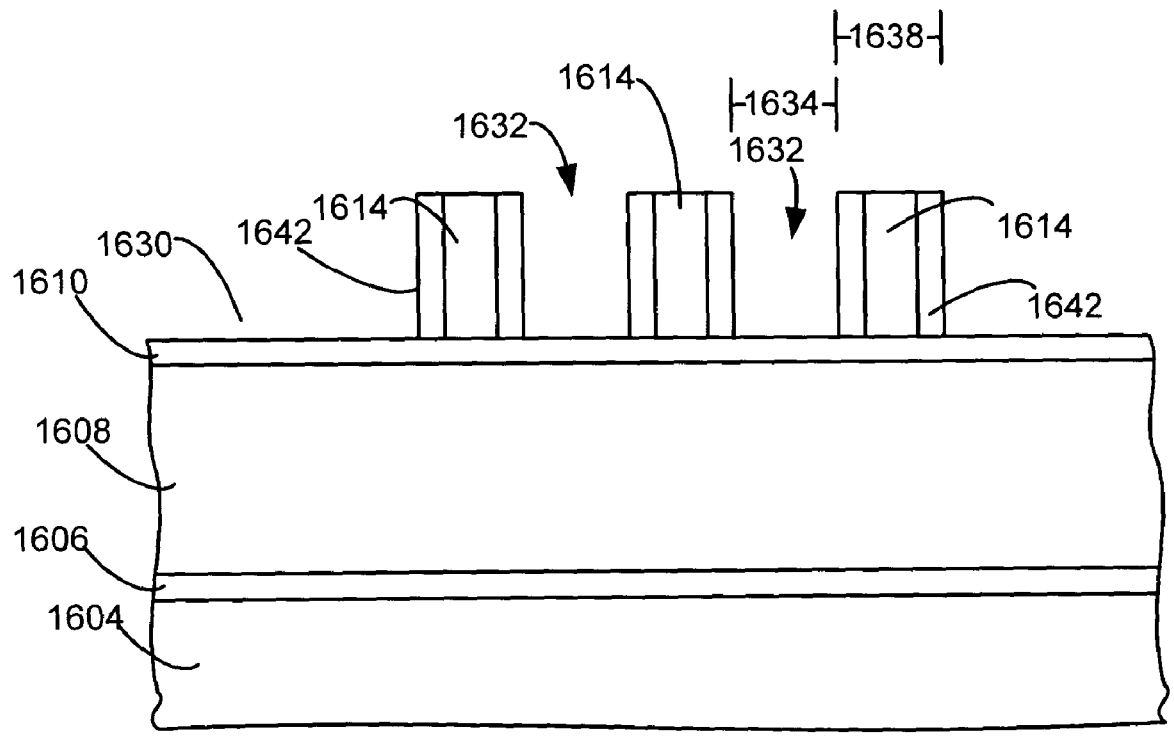
Figure 16D:
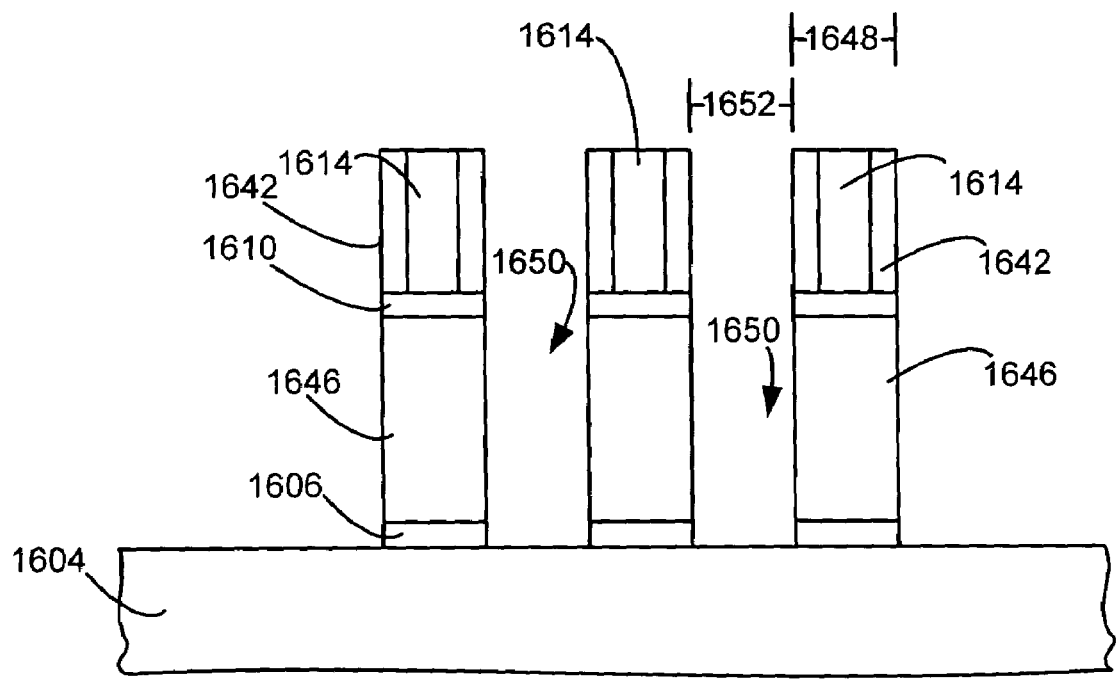

In the preferred embodiment for etching a conductive layer, the deposition layer is conformal in all directions (isotropic). This results in the layer over the ARL 1610 to be about as thick as the layer on the sidewalls of the mask The conductive layer 1608 may be etched through the deposited layer 1630 (step 212). In this example, the etching step comprises at least two separate etches, as illustrated in FIG. 17. An anisotropic deposition layer etch is used to etch the deposited layer 1630 (step 1704). FIG. 16C is a cross-sectional view of the substrate after the deposited layer is anisotropically etched. The remaining deposited layer forms sidewalls 1642 around the mask lines 1614. An anisotropic conductive layer etch is used to etch into the conductive layer 1608 (step 1708). FIG. 16D is a cross-sectional view of the substrate after the conductive layer is etched to form conductive lines 1646 with spaces 1650 formed therebetween. The conductive lines 1646 have a width 1648 and the spaces between the conductive lines have a width 1652, as shown in FIG. 16D. Preferably, the width 1652 of the space 1650 between the conductive lines is at least 20% less than the width 1616 of the space 1620 between the mask lines. More preferably, the width 1652 of the space 1650 between the conductive lines is at least 50% less than the width 1616 of the space 1620 between the mask lines. Most preferably, the width 1652 of the space 1650 between the conductive lines is at least 70% less than the width 1616 of the space 1620 between the mask lines.

Figure 16E:
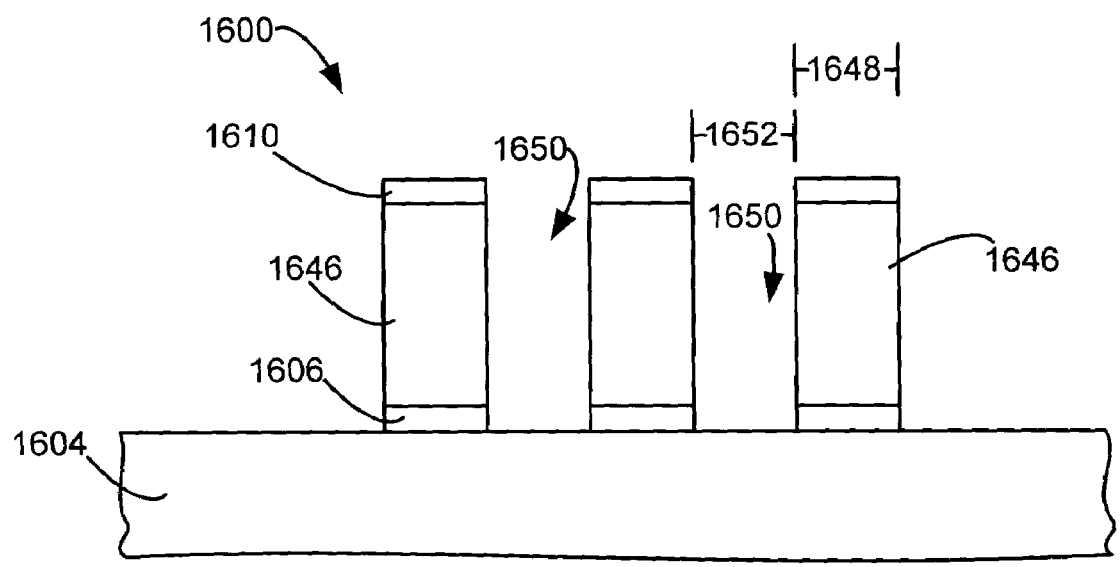

The photoresist and deposited layer may then be stripped (step 216). This may be done as a single step or two separate steps with a separate deposited layer removal step and photoresist strip step. Ashing may be used for the stripping process. FIG. 16E shows the stack 1600 after the deposited layer and photoresist mask have been removed. Additional processes may be performed (step 220). For example, the conductive lines may be formed to be part of a memory device.

The resulting structure provides a higher density device with smaller spacing and wider conductive lines. In this example, the widths 1648 of the conductive lines 1646 are about equal to the widths 1652 of the spaces 1650. Other conductive line width to space width ratios may be provided by this embodiment. Preferably, the ratio of the width of the mask line to the width of the space between mask lines is less than 1:1, where the ratios of the width of the conductive line to the space between the conductive line is not less than 1:1, and even more preferably greater than 1:1. Such ratios may be useful in providing higher density memory devices, where the conductive layer is a polysilicon.

Figure 18A:
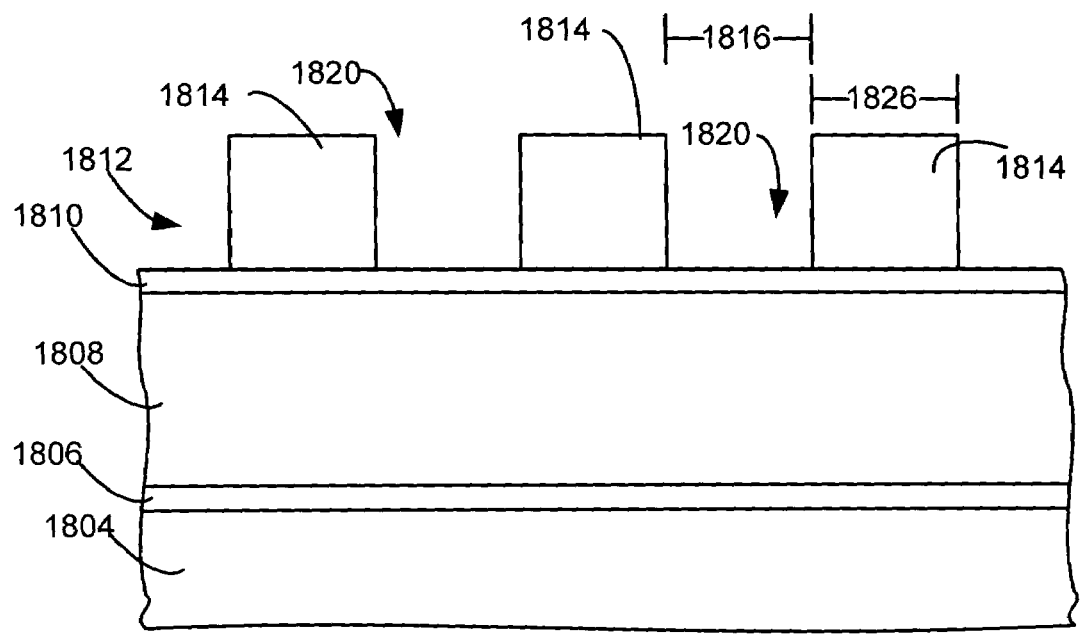
FIGS. 18A-D are schematic cross-sectional views of a conductive layer processed according to an embodiment of the invention.

In another embodiment of the invention, the mask lines have a width that is about equal to the width of the space. FIG. 18A is a cross-sectional view of a conductive layer to be etched 1808 over a barrier layer 1806 over a substrate 1804, with a patterned photoresist mask 1812 forming mask lines 1814, with mask spaces 1820 therebetween, over an ARL 1810, over the conductive layer 1808 to be etched. The photoresist mask has a space critical dimension (CD), which is the width 1816 of the space, and a line CD, which is the width 1826 of the mask lines 1814. Generally, the width of the space in the photoresist is made wide enough to provide the formation of the space in the photoresist without photoresist residue in the space.

Figure 18B:
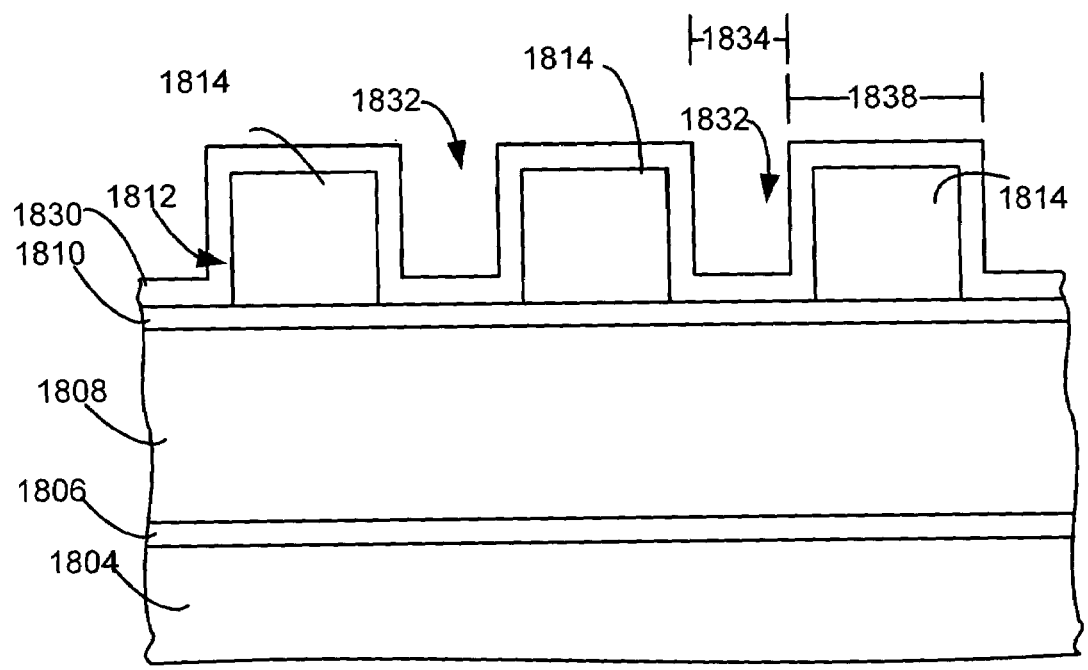

A conformal layer is then deposited over the sidewalls of the photoresist features to reduced the width of the space (step 208). FIG. 18B is a schematic cross-sectional view of the patterned photoresist mask 1812 with a layer 1830 deposited over the sidewalls of the mask 1812. The deposited layer 1830 forms a deposited layer space 1832 within the mask space, where the deposited layer space 1832 has a reduced width (CD) 1834 that is less than the width 1816 of the mask space. In addition, the deposited layer 1830 forms deposited layer mask lines with a width 1838 that is greater than the width 1826 of the mask lines 1814.

Figure 18C:
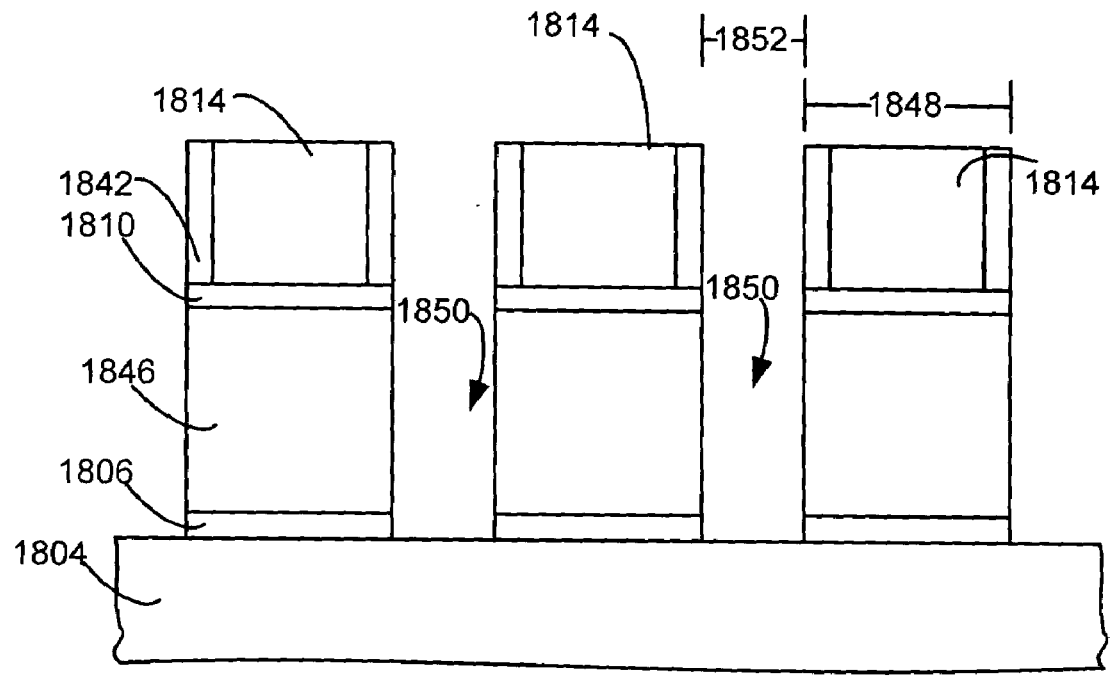

The conductive layer 1808 may be etched through the deposited layer 1830 (step 212). FIG. 18C is a cross-sectional view of the substrate after the conductive layer is etched to form conductive lines 1846 with spaces 1850 formed therebetween. The conductive lines 1846 have a width 1848 and the spaces between the conductive lines have a width 1852, as shown in FIG. 18C.

Figure 18D:
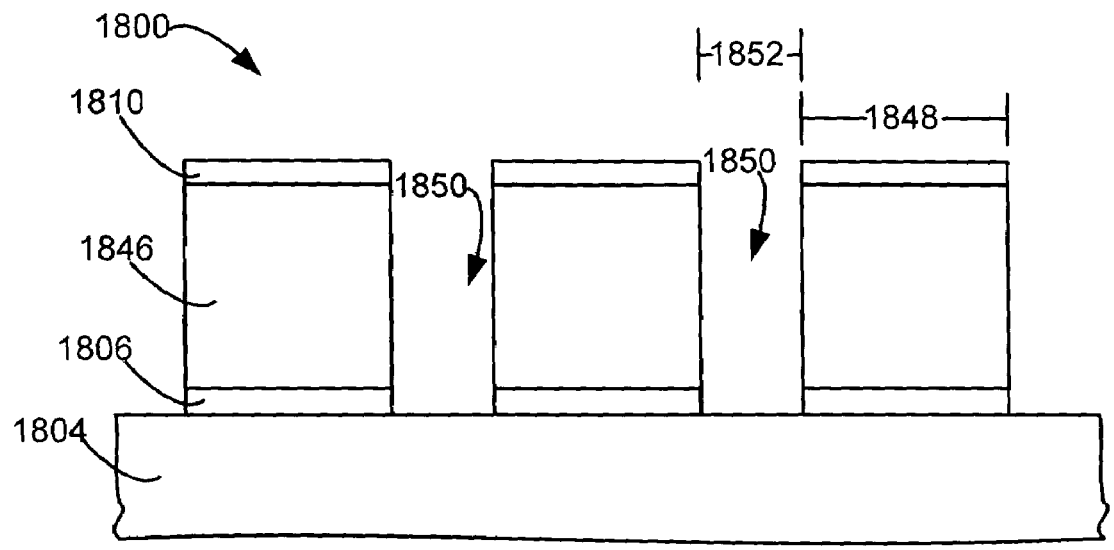

The photoresist and deposited layer may then be stripped (step 216). FIG. 18D shows the stack 1800 after the deposited layer and photoresist mask have been removed. Additional processes may be performed (step 220). For example, the metal lines may be used for electrically connecting various devices.

The resulting structure provides wider conductive wires that are more closely spaced. In this example, although the conductive metal lines may have the same density as done previously, providing wider conductive lines with smaller spacing improves the performance of the conductive lines, such as by providing a reduced resistance. The inventions may provide a conductive line width that is more than 100% greater than the line width of the original mask. More preferably, the conductive line width is more than 150% greater than the line width of the original mask. In this embodiment, the deposition steps are in order and are not simultaneous.

EXAMPLE RECIPE

Figure 19:
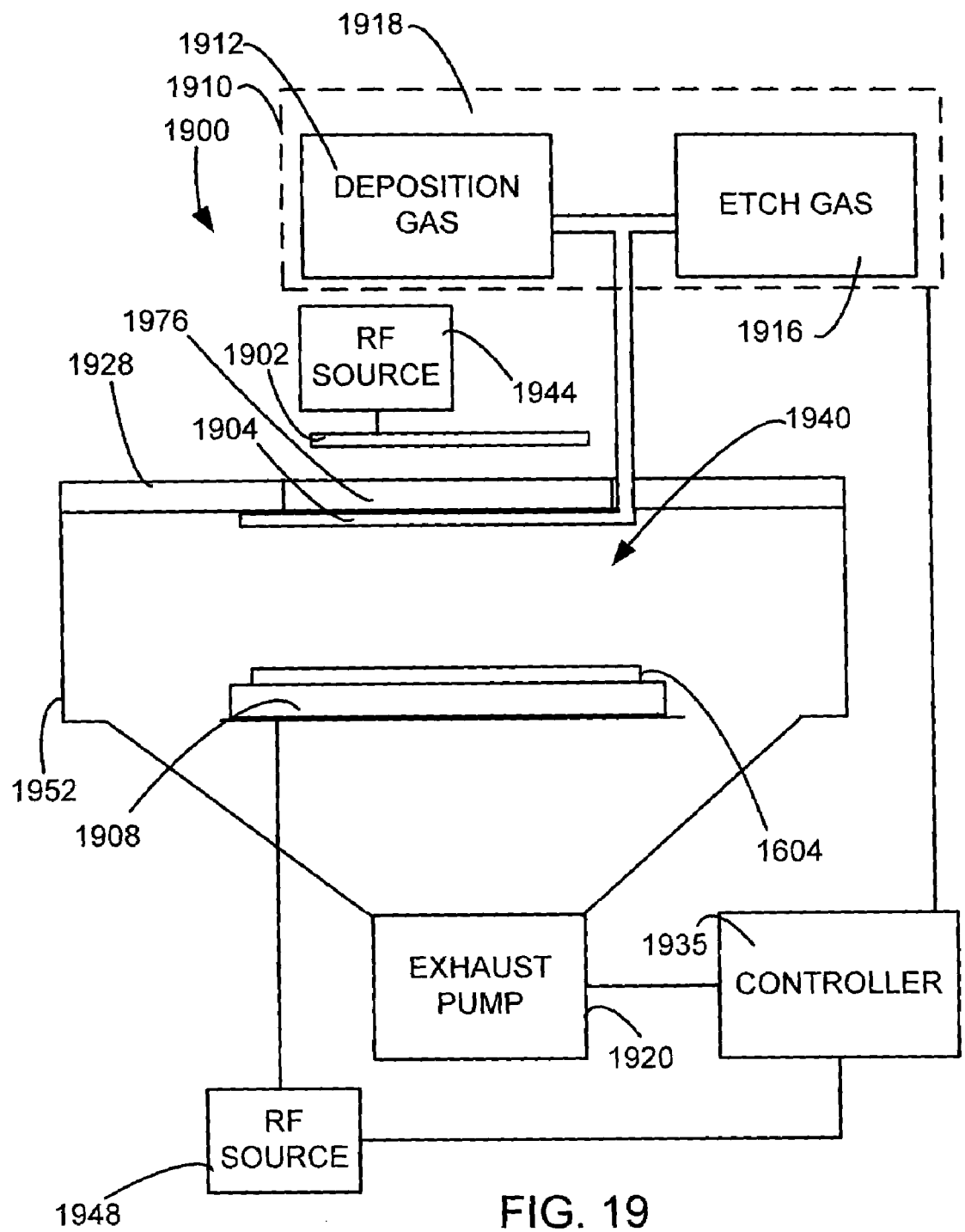
FIG. 19 is a schematic illustration of a device that may be used for practicing the invention for etching conductive layers.

In an example recipe, a device that may be used for both depositing and etching the deposition layer and the conductive layer is the 2300 Versys™ made by LAM Research Corporation™ of Fremont, Calif. FIG. 19 is a schematic illustration of such a device 1900 used for both depositing and etching the deposition layer. The plasma processing chamber 1900 comprises an inductive antenna (or coil) 1902, a gas distribution plate (GDP) 1904, a substrate support 1908, a gas source 1910, and an exhaust pump 1920. The gas source 1910 is in fluid connection with the gas distribution plate 1904 and comprises a deposition gas source 1912 and an etch gas source 1916. The gas source 1910 may comprise additional gas sources, such as a second etching or deposition gas source. Within plasma processing chamber 1900, the substrate 1604 is positioned upon the substrate support 1908. The substrate support 1908 incorporates a suitable substrate chucking mechanism (e.g., electrostatic, mechanical clamping, or the like) for holding the substrate 1604. The reactor top 1928 incorporates a quartz dielectric window 1976, which allows the transmission of energy from the antenna 1902 into the chamber. The dielectric window 1976, the substrate support 1908, and anodized aluminum chamber walls 1952 define the confined plasma volume. Gas is supplied to the confined plasma volume by the gas source 1910 and is exhausted from the confined plasma volume through an exhaust port by the exhaust pump 1920. A first RF source 1944 is electrically connected to the antenna. A second RF source 1948 is electrically connected to the substrate support 1908. In this example, the first RF source 1944 provides a signal with a 13.56 MHz frequency, and the second RF source 1948 provides a signal with a 13.56 MHz frequency.

During the deposition of the deposition layer (step 208), a pressure of 10 mTorr is provided to the chamber. The first RF source 1944 provides 1000 Watts (TCP power) by the antenna 1902 through the dielectric window 1976 into the plasma volume 1940. No bias power is provided to the substrate holder 1908. The deposition gas source 1912 provides a flow of 50 sccm $SiCl_4$ and 100 sccm $O_2$ for a 15 second deposition. This forms a 1,000-2,000 Å thick layer of $SiCl_xO_y$. Such a film may be an oxide film, which is strong enough to resist ething.

During the anisotropic etch of the deposition layer (step 1704) a pressure of 5 mTorr is provided to the chamber. The first RF source 1994 provides 500 Watts by the antenna 1902 to the plasma volume 1940. A bias of −175 volts is applied to the substrate support to accelerate positive ions to the substrate to facilitate etching. The etch gas source 1916 provides 100 sccm of $CF_4$.

The anisotropic etch of the conductive layer (step 1708) is accomplished using four etches a BT (breakthrough) etch, an ME1 (main etch 1), ME2 (main etch 2), and an OE (over etch). For the BT a 5 mTorr pressure is provided. 500 Watts are provided through the antenna 1902 to the chamber 1900. A bias of −175 volts is applied to the substrate support 1908 to accelerate ions to the substrate to facilitate etching. The etch source provide 100 sccm of $CF_4$ for about 10 seconds.

For the ME1 a 10 mTorr pressure is provided. 800 Watts are provided through the antenna 1902 to the chamber 1900. A bias of −90 volts is applied to the substrate support 1908 to accelerate ions to the substrate to facilitate etching. The etch source provide 100 sccm of $Cl_2$, 100 sccm HBr, and 5 sccm $O_2$ for about 45 seconds.

For the ME2 a 20 mTorr pressure is provided. 400 Watts are provided through the antenna 1902 to the chamber 1900. A bias of −170 volts is applied to the substrate support 1908 to accelerate ions to the substrate to facilitate etching. The etch source provide 20 sccm of $Cl_2$, 360 sccm HBr, and 5 sccm $O_2$. An endpoint detection is used to determine when to stop this etch.

For the OE a 60 mTorr pressure is provided. 500 Watts are provided through the antenna 1902 to the chamber 1900. A bias of −210 volts is applied to the substrate support 1908 to accelerate ions to the substrate to facilitate etching. The etch source provide 267 sccm of He, 133 sccm HBr, and 2 sccm $O_2$ for about 80 seconds.

Other embodiments may use a hardmask for the mask. In such embodiments, a photoresist mask may be used to open a hardmask. The deposition layer may be placed over the hardmask to reduce the spacing. In the alternative, the deposition layer may be placed over the photoresist before etching the hardmask.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of forming a plurality of conductive lines, comprising:
    placing a conductive layer over a substrate;
    forming a mask, wherein the mask defines a plurality of mask lines with mask spaces between the mask lines, wherein the mask spaces have a width and wherein the mask lines have a width and have sidewalls;
    placing the substrate in a plasma processing chamber
    depositing a conformal layer over the sidewalls of the mask, while the substrate is in the plasma processing chamber, wherein the depositing the conformal layer provides a portion of the bottom of a via without deposited conformal layer;
    etching the conductive layer through the mask to form conductive lines and spaces between the conductive lines, while the substrate is in the plasma processing chamber, wherein the conductive lines have a width and the spaces between the conductive line have widths, wherein the widths of the spaces between the conductive lines is less than the widths of the mask spaces, and wherein the widths of the conductive lines is greater than the widths of the line masks.

2. The method, as recited in claim 1, wherein a ratio of the widths of the mask lines to the widths of the mask spaces is less than 1:1 and wherein a ratio of the widths of the conductive lines to the widths of the spaces between the conductive lines is not less than 1:1.

3. The method, as recited in claim 1, wherein a ratio of the widths of the mask lines to the widths of the mask spaces is less than 1:1 and wherein a ratio of the widths of the conductive lines to the widths of the spaces between the conductive lines is greater than 1:1.

4. The method, as recited in claim 1, further comprising etching the conformal layer with a first etch recipe, wherein the etching of the conductive layer uses a second etch recipe, which is different than the first etch recipe.

5. The method, as recited in claim 1, further comprising stripping the conformal layer and mask with a single stripping step, while the substrate is in the plasma processing chamber.

6. A method for forming a feature in a layer, comprising:
    forming a photoresist layer over the layer;
    patterning the photoresist layer to form photoresist features with photoresist sidewalls, where the photoresist features have a first critical dimension;
    depositing a conformal layer over the sidewalls of the photoresist features to reduce the critical dimensions of the photoresist features, comprising:
        a first deposition with a first gas chemistry to form a first deposition plasma; and
        a second deposition with a second gas chemistry to form a second deposition plasma, wherein the first gas chemistry is different than the second gas chemistry; and
    etching features into the layer, wherein the layer features have a second critical dimension, which is less than the first critical dimension, wherein the depositing the conformal layer provides a portion of the bottom of the via without deposited conformal layer.

7. A method for forming a feature in a layer, comprising:
    forming a photoresist layer over the layer;
    patterning the photoresist layer to form photoresist features with photoresist sidewalls, where the photoresist features have a first critical dimension;
    depositing a layer over the sidewalls of the photoresist features to reduce the critical dimensions of the photoresist features, wherein the depositing the layer over the sidewalls of the photoresist feature, comprises:
        a first deposition with a first gas chemistry to form a first deposition plasma; and
        a second deposition with a second gas chemistry to form a second deposition plasma, wherein the first gas chemistry is different than the second gas chemistry; and
    etching features into the layer, wherein the layer features have a second critical dimension, wherein the second critical dimension is not greater than 70% of the first critical dimension, wherein the depositing the layer provides a portion of the bottom of the via without deposited conformal layer.

8. A method for forming a feature in an etch layer over a substrate, comprising:
- forming a photoresist layer over the etch layer;
- patterning the photoresist layer to form photoresist features with photoresist sidewalls, where the photoresist features have a first critical dimension;
- placing the substrate in a plasma processing chamber;
- depositing a conformal layer over the sidewalls of the photoresist features to reduce the critical dimensions of the photoresist features, while the substrate is in the plasma processing chamber, wherein the depositing the conformal layer provides a portion of the bottom of the via without deposited conformal layer; and
- etching features into the etch layer, while the substrate is in the plasma processing chamber wherein the layer features have a second critical dimension, which is less than the first critical dimension.

9. The method, as recited in claim 8, further comprising stripping the conformal layer and photoresist layer with a single stripping step, while the substrate is in the plasma processing chamber.

10. A method for forming a feature in a layer, comprising:
- forming a photoresist layer over the layer;
- patterning the photoresist layer to form photoresist features with photoresist sidewalls, where the photoresist features have a first critical dimension;
- depositing a conformal layer over the sidewalls of the photoresist features to reduce the critical dimensions of the photoresist features, comprising:
  - a first deposition with a first gas chemistry to form a first deposition plasma; and
  - a second deposition with a second gas chemistry to form a second deposition plasma, wherein the first gas chemistry is different than the second gas chemistry; and
- etching features into the layer, wherein the layer features have a second critical dimension, which is less than the first critical dimension, wherein the first deposition is selected from the group of a bread-loafing deposition a faceting deposition and the second deposition is selected from the group of a bread loafing deposition and a faceting deposition, where the first deposition and second deposition are not both bread loafing depositions and are not both faceting depositions.

11. A method for forming a feature in a layer, comprising:
- forming a photoresist layer over the layer;
- patterning the photoresist layer to form photoresist features with photoresist sidewalls, where the photoresist features have a first critical dimension;
- depositing a layer over the sidewalls of the photoresist features to reduce the critical dimensions of the photoresist features, wherein the depositing the layer over the sidewalls of the photoresist feature, comprises:
  - a first deposition with a first gas chemistry to form a first deposition plasma; and
  - a second deposition with a second gas chemistry to form a second deposition plasma, wherein the first gas chemistry is different than the second gas chemistry; and
- etching features into the layer, wherein the layer features have a second critical dimension, wherein the second critical dimension is not greater than 70% of the first critical dimension, wherein the first deposition is selected from the group of a bread-loafing deposition a faceting deposition and the second deposition is selected from the group of the group of a bread loafing deposition and a faceting deposition, where the first deposition and second deposition are not both bread loafing depositions and are not both faceting depositions.

* * * * *